(12) United States Patent
Kim et al.

(10) Patent No.: US 7,868,411 B2
(45) Date of Patent: Jan. 11, 2011

(54) SEMICONDUCTOR DEVICES

(75) Inventors: Wook-Je Kim, Gyeonggi-do (KR);
Satoru Yamada, Seoul (KR);
Shin-Deuk Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 284 days.

(21) Appl. No.: 12/115,745

(22) Filed: May 6, 2008

(65) Prior Publication Data

US 2008/0277710 A1    Nov. 13, 2008

(30) Foreign Application Priority Data

May 8, 2007    (KR)    ...................... 10-2007-0044596

(51) Int. Cl.
*H01L 21/70* (2006.01)

(52) U.S. Cl. .............................. 257/501; 257/E29.255; 257/E27.013

(58) Field of Classification Search ................. 257/385, 257/E29.255, 501, E27.013
See application file for complete search history.

(56) References Cited

U.S. PATENT DOCUMENTS

| | | | |
|---|---|---|---|
| 5,946,230 A * | 8/1999 | Shimizu et al. | ........ 365/185.01 |
| 6,309,960 B1 | 10/2001 | Sukekawa | |
| 6,686,617 B2 | 2/2004 | Agnello et al. | |
| 6,699,746 B2 | 3/2004 | Chung et al. | |
| 7,001,808 B2 * | 2/2006 | Tsukamoto et al. | ......... 438/257 |
| 7,179,744 B2 | 2/2007 | Lee et al. | |
| 7,462,542 B2 | 12/2008 | Liu et al. | |
| 7,692,234 B2 * | 4/2010 | Adachi et al. | ................ 257/316 |
| 2003/0139027 A1 | 7/2003 | Ikeda et al. | |
| 2006/0035437 A1 * | 2/2006 | Mitsuhira et al. | ........... 438/424 |
| 2006/0263985 A1 | 11/2006 | Kang et al. | |

FOREIGN PATENT DOCUMENTS

| | | |
|---|---|---|
| JP | 04-188762 | 7/1992 |
| JP | 10-173146 | 6/1998 |
| JP | 11-017129 | 1/1999 |
| JP | 2000-277610 | 10/2000 |
| JP | 2003-289112 | 10/2003 |
| KR | 1020000076930 A | 12/2000 |
| KR | 100295039 B1 | 4/2001 |
| KR | 1020010067355 A | 7/2001 |
| KR | 1020003058640 A | 7/2003 |
| KR | 1020030058573 A | 7/2003 |
| KR | 1020040057702 A | 7/2004 |
| KR | 1020040085349 A | 10/2004 |
| KR | 1020050036627 A | 4/2005 |
| KR | 1020060059088 A | 6/2006 |
| KR | 1020060093974 A | 8/2006 |

* cited by examiner

*Primary Examiner*—Jerome Jackson, Jr.
*Assistant Examiner*—Paul A Budd
(74) *Attorney, Agent, or Firm*—Myers Bigel Sibley & Sajovec, P.A.

(57) ABSTRACT

Provided are semiconductor devices and methods of forming the same. In the semiconductor devices and methods of forming the same, different insulating patterns are disposed around a cell gate pattern and a peripheral gate pattern to impose different heat budgets around the cell gate pattern and the peripheral gate pattern. For this purpose, a semiconductor substrate having a cell array region and a peripheral circuit region is prepared. First and second cell gate patterns are disposed in the cell array region. A peripheral gate pattern is disposed in the peripheral circuit region to be adjacent to the second cell gate pattern. Buried insulating patterns are disposed around the first and second cell gate patterns. Planarization insulating patterns are disposed around the peripheral gate pattern.

2 Claims, 16 Drawing Sheets

SEMICONDUCTOR DEVICES

CROSS-REFERENCE TO RELATED APPLICATION

This patent application claims priority from Korean Patent Application No. 10-2007-0044596, filed May 8, 2007, the contents of which are hereby incorporated by reference in their entirety.

FIELD OF THE INVENTION

The present invention relates generally to semiconductor devices and, more particularly to semiconductor fabrication.

BACKGROUND

Generally, semiconductor devices are fabricated using a semiconductor substrate having a cell array region and a peripheral circuit region. The semiconductor substrate has a plurality of cell gate patterns in the cell array region and a plurality of peripheral gate patterns in the peripheral circuit region. The cell gate patterns and the peripheral gate patterns are simultaneously formed on the semiconductor substrate for simplifying a semiconductor manufacturing process. The cell gate patterns and the peripheral gate patterns are formed to overlap impurity diffusion regions disposed in the semiconductor substrate. Also, the cell gate patterns and the peripheral gate patterns are covered with an insulating layer, which is selected for simplifying a semiconductor manufacturing process. As a result, using the selected insulating layer results in the same heat budget imposed on the cell gate patterns and the peripheral gate patterns, and thus may provide a way for easily controlling electrical characteristics of a semiconductor device.

However, when the selected insulating layer is used, the electrical characteristics of the semiconductor device may not be easily controlled according to a reduced design rule of a semiconductor device. This is because the cell and peripheral gate patterns and impurity diffusion regions should be smaller in size as compared with prior devices to the reduced design rule for the sake of high integration density. When the selected insulating layer is used, the size of the impurity diffusion regions cannot be smaller below the cell and/or peripheral gate patterns as compared with prior to the reduced design rule. Accordingly, using the selected insulating layer may prevent a semiconductor device from having high integration density.

A semiconductor integrated circuit device having a selective insulating layer is disclosed in Japanese Laid-Open Patent Publication No. JP11-17129 to Yoshida Makoto et al. According to Japanese Laid-Open Patent Publication No. JP11-17129, a semiconductor substrate having a logic portion and a DRAM portion is prepared. Gate electrodes and semiconductor regions are formed in the logic portion and the DRAM portion of the semiconductor substrate. The semiconductor regions are formed to overlap the gate electrodes in the logic portion and the DRAM portion of the semiconductor substrate. The semiconductor regions are impurity diffusion regions. A silicon oxide layer is disposed on the semiconductor substrate to cover the gate electrodes. As a result, the silicon oxide layer constitutes the semiconductor integrated circuit device together with the gate electrodes and the semiconductor regions.

However, the semiconductor integrated circuit device cannot have a smaller size of the semiconductor regions below the gate electrodes as compared with prior to a reduced design rule while the silicon oxide layer is formed in the logic portion and the DRAM portion of the semiconductor substrate. This is because the silicon oxide layer is covered with the logic portion and the DRAM portion at the same time, and imposes the same heat budget on the semiconductor regions. Therefore, the semiconductor regions may be diffused downwardly from the gate as much as prior to the reduced design rule. As a result, the silicon oxide layer may not correspond to the reduced design rule, so that it can be difficult to realize a semiconductor integrated circuit device having high integration density.

SUMMARY OF THE INVENTION

An embodiment of the invention provides semiconductor devices having different insulating patterns disposed in a cell array region and a peripheral circuit region.

Another embodiment of the invention provides methods of forming a semiconductor device, in which different insulating patterns are formed in a cell array region and a peripheral circuit region to impose different heat budgets on the respective regions.

In one aspect, the present invention is directed to semiconductor devices having different insulating patterns disposed in a cell array region and a peripheral circuit region. The semiconductor device includes a semiconductor substrate having a cell array region and a peripheral circuit region. First and second cell gate patterns are disposed in the cell array region. The first and second cell gate patterns are sequentially arranged outwardly from a center of the cell array region. A peripheral gate pattern is disposed in the peripheral circuit region. A defining pattern is disposed between the cell array region and the peripheral circuit region to surround the cell array region. Buried insulating patterns are disposed around the first cell gate pattern, between the first and second cell gate patterns, and between the second cell gate pattern and the defining pattern. Planarization insulating patterns are disposed between the defining pattern and the peripheral gate pattern, and around the peripheral gate pattern.

In selected embodiments of the present invention, the semiconductor device may further include isolation regions disposed in the cell array region and the peripheral circuit region to define a cell active region of the cell array region and a peripheral active region of the peripheral circuit region. The first and second cell gate patterns may have a lower cell gate electrode, an upper cell gate electrode and a cell gate capping pattern, which are sequentially stacked. The first and second cell gate patterns may be respectively disposed on the cell active region and the isolation regions. The peripheral gate pattern may have a lower peripheral gate electrode, an upper peripheral gate electrode and a peripheral gate capping pattern, which are sequentially stacked, to be disposed on the peripheral active region.

In other embodiments of the present invention, the semiconductor device may further include cell spacers respectively disposed on sidewalls of the first and second cell gate patterns, and a part of peripheral spacer patterns disposed on sidewalls of the peripheral gate pattern. Also, the semiconductor device may further include the other peripheral spacer pattern disposed between the second cell gate pattern and the peripheral gate pattern to be in contact with a buried insulating pattern and a planarization insulating pattern. Here, the defining pattern may be a cell space pattern disposed on the isolation regions between the second cell gate pattern and the peripheral gate pattern. The cell space pattern may be disposed below the other peripheral spacer pattern.

In still other embodiments of the present invention, the semiconductor device may further include the other cell spacer and the other peripheral spacer pattern disposed on sidewalls of the defining pattern. Here, the defining pattern may be a dummy gate pattern disposed on the isolation regions between the second cell gate pattern and the peripheral gate pattern. Also, the dummy gate pattern may be a lower dummy gate, an upper dummy gate and a dummy capping pattern, which are sequentially stacked.

In another aspect, the present invention is directed to a semiconductor device including a semiconductor substrate having a cell array region and a peripheral circuit region. First and second cell gate patterns are disposed in the cell array region. The first and second cell gate patterns are sequentially arranged outwardly from a center of the cell array region. A peripheral gate pattern is disposed in the peripheral circuit region. A buried insulating pattern is disposed around the cell gate patterns, and between the first and second cell gate patterns. Planarization insulating patterns are disposed between the second cell gate pattern and the peripheral gate pattern, and around the peripheral gate pattern.

In selected embodiments of the present invention, the semiconductor device may further include isolation regions disposed in the cell array region and the peripheral circuit region to define a cell active region of the cell array region and a peripheral active region of the peripheral circuit region. The first and second cell gate patterns may have a lower cell gate electrode, an upper cell gate electrode and a cell gate capping pattern, which are sequentially stacked. The first and second cell gate patterns may be respectively disposed on the cell active region and the isolation regions.

In still other embodiments of the present invention, the peripheral gate pattern may have a lower peripheral gate electrode, an upper peripheral gate electrode and a peripheral gate capping pattern, which are sequentially stacked, to be disposed on the peripheral active region. The semiconductor device may further include cell spacers disposed on sidewalls of the first cell gate pattern and one sidewall of the second cell gate pattern, and peripheral spacer patterns disposed on the other sidewall of the second cell gate pattern and sidewalls of the peripheral gate pattern.

In still another aspect, the present invention is directed to methods of forming a semiconductor device, in which different insulating patterns are formed in a cell array region and a peripheral circuit region to impose different heat budgets to the regions. The methods include preparing a semiconductor substrate. The semiconductor device has a cell array region and a peripheral circuit region. First and second cell gate patterns and a preliminary peripheral gate pattern are formed on the semiconductor substrate. The first and second cell gate patterns are formed in the cell array region. The preliminary peripheral gate pattern is formed in the peripheral circuit region to be adjacent to the second cell gate pattern by extending from the cell array region. Cell spacers are formed on sidewalls of the first and second cell gate patterns and the preliminary peripheral gate pattern. Buried insulating patterns are formed around the first cell gate pattern, and between the first and second cell gate patterns and the preliminary peripheral gate pattern. Mask patterns are formed on the first and second cell gate patterns, and the preliminary peripheral gate pattern. A defining pattern is formed in the cell array, and a peripheral gate pattern is formed in the peripheral circuit region to be aligned with the mask patterns. The defining pattern is formed to be disposed between the second cell gate pattern and the peripheral gate pattern. Planarization insulating patterns surrounding the peripheral gate pattern are formed.

In selected embodiments of the present invention, the methods may further include isolation regions defining a cell active region of the cell array region and a peripheral active region of the peripheral circuit region. Here, the first and second cell gate patterns may be respectively formed on the cell active region and the isolation regions. The respective first and second cell gate patterns may be formed to have a lower cell gate electrode, an upper cell gate electrode and a cell gate capping pattern, which are sequentially stacked. The peripheral gate pattern may be formed to be disposed on the peripheral active region and to have a lower peripheral gate electrode, an upper peripheral gate electrode and a peripheral gate capping pattern, which are sequentially stacked. Also, the preliminary peripheral gate pattern may be formed to be disposed on the isolation regions and the peripheral active region to have a lower peripheral conductive layer, an upper peripheral conductive layer and a peripheral capping layer, which are sequentially stacked.

Also, in the selected embodiments of the present invention, forming the mask patterns may include sequentially forming a lower mask layer, an intermediate mask layer and an upper mask layer that cover the first and second cell gate patterns, the preliminary peripheral gate pattern, the buried insulating patterns, and the cell spacers, and forming photoresist patterns on the upper mask layer. Here, one of the photoresist patterns may be formed to cover the cell array region, and its end may be disposed between the second cell gate pattern and the preliminary peripheral gate pattern. Also, the other photoresist pattern may be disposed in the peripheral circuit region to overlap the peripheral active region.

Moreover, forming the mask patterns may include sequentially etching the upper and intermediate mask layers using the photoresist patterns as an etch mask to form upper and intermediate mask patterns, wherein the photoresist patterns are removed from the upper mask patterns while the intermediate mask patterns are formed, and etching the lower mask layer using the upper and intermediate mask patterns as an etch mask to form a lower mask pattern.

In the selected embodiments of the present invention, forming the defining pattern and the peripheral gate pattern may include partially etching the cell spacer in the cell array region using the upper, intermediate and lower mask patterns as an etch mask to form a cell space pattern corresponding to the defining pattern, and etching the peripheral capping layer and the upper peripheral conductive layer in the peripheral circuit region using the upper, intermediate and lower mask patterns as an etch mask to simultaneously form the peripheral gate capping pattern and the upper peripheral gate electrode together with the cell space pattern.

Meanwhile, the upper and intermediate mask patterns may be removed from the lower mask patterns while the peripheral gate capping pattern, the upper peripheral gate electrode, and the cell space pattern are formed. Also, forming the defining pattern and the peripheral gate pattern may further include etching the lower peripheral conductive layer using the lower mask patterns and the cell space pattern as an etch mask to form a lower peripheral gate electrode.

In the selected embodiments of the present invention, the methods may further include forming peripheral spacers on sidewalls of the selected lower mask pattern and the buried insulating pattern to be disposed on the defining pattern of the cell array region, and sidewalls of the other lower mask pattern and the peripheral gate pattern to be disposed in the peripheral circuit region. Also, forming the planarization insulating patterns may include forming a planarization insulating layer to cover the peripheral spacers and the lower mask layers and fill between the second cell gate pattern and the peripheral gate pattern, and performing a planarization process on the planarization insulating layer, the lower mask patterns, and the peripheral spacers to expose the first and second cell gate patterns, the peripheral gate pattern, and the buried insulating patterns.

In still other embodiments of the present invention, forming the mask patterns may include sequentially forming a lower mask layer, an intermediate mask layer and an upper mask layer that cover the first and second cell gate patterns, the preliminary peripheral gate pattern, the buried insulating patterns and the cell spacers, and forming photoresist patterns on the upper mask layer. Here, one of the photoresist patterns may be formed to extend from the cell array region to partially cover the preliminary peripheral gate pattern. Also, the other photoresist pattern may be formed to be disposed in the peripheral circuit region to overlap the peripheral active region.

Furthermore, forming the mask patterns may further include sequentially etching the upper and intermediate mask layers using the photoresist patterns as an etch mask to form upper and intermediate mask patterns, wherein the photoresist patterns are removed from the upper mask patterns while the intermediate mask patterns are formed, and etching the lower mask layer using the upper and intermediate mask patterns as an etch mask to form a lower mask pattern.

In still other embodiments of the present invention, forming the defining pattern and the peripheral gate pattern may include etching the peripheral capping layer and the upper peripheral conductive layer using the upper, intermediate and lower mask patterns as an etch mask to form an upper dummy gate and a dummy capping pattern, which are sequentially stacked, between the cell array region and the peripheral circuit region, and to form an upper peripheral gate electrode and a peripheral gate capping pattern, which are sequentially stacked, in the peripheral circuit region.

Meanwhile, the upper and intermediate mask patterns may be removed from the lower mask patterns while the dummy capping pattern, the upper dummy gate, the peripheral gate capping pattern, and the upper peripheral gate electrode are formed. In addition, forming the defining pattern and the peripheral gate pattern may further include etching the lower peripheral conductive layer using the lower mask patterns as an etch mask to form a lower dummy gate below the upper dummy gate and a lower peripheral gate electrode below the upper peripheral gate electrode.

In still other embodiments of the present invention, the methods may further include forming peripheral spacers on sidewalls of the selected lower mask pattern and the dummy gate pattern to be disposed in the cell array region, and on sidewalls of the other lower mask pattern and the peripheral gate pattern to be disposed in the peripheral circuit region. Also, forming the planarization insulating patterns may include forming a planarization insulating layer to cover the peripheral spacers and the lower mask layers and fill between the dummy gate pattern and the peripheral gate pattern, and performing a planarization process on the planarization insulating layer, the lower mask patterns, and the peripheral spacers to expose the first and second cell gate patterns, the dummy gate pattern, the peripheral gate pattern and the buried insulating patterns.

In still other embodiments of the present invention, forming the buried insulating patterns may include forming a buried insulating layer to cover the cell spacers and fill between the first and second cell gate patterns and the preliminary peripheral gate pattern, and performing a planarization process on the buried insulating layer to expose the first and second cell gate patterns and the preliminary peripheral gate pattern.

In still other embodiments of the present invention, forming the first and second cell gate patterns and the preliminary peripheral gate pattern may include sequentially forming a lower conductive layer, an upper conductive layer and a capping layer on the semiconductor substrate, and forming photoresist patterns on the capping layer. Here, a part of the photoresist patterns may be disposed in the cell array region to overlap the first and second cell gate patterns. Also, the other photoresist pattern may be formed to cover the peripheral circuit region to overlap the preliminary peripheral gate pattern.

In addition, forming the first and second cell gate patterns and the preliminary peripheral gate pattern may further include sequentially etching the capping layer, the upper conductive layer and the lower conductive layer using the photoresist patterns as an etch mask, and removing the photoresist patterns from the semiconductor substrate.

In yet another aspect, the present invention is directed to methods of forming a semiconductor device. The methods include preparing a semiconductor substrate. The semiconductor substrate has a cell array region and a peripheral circuit region. A first cell gate pattern is formed in the cell array region, and a preliminary peripheral gate pattern is formed adjacent to the first cell gate pattern in the peripheral circuit region by extending from the cell array region. Cell spacers are formed on sidewalls of the first cell gate pattern and the preliminary peripheral gate pattern. Buried insulating patterns are formed between the first cell gate pattern and the preliminary peripheral gate pattern, and around the first cell gate pattern. Mask patterns are formed on the first cell gate pattern and the preliminary peripheral gate pattern. A second cell gate pattern is formed in the cell array region and a peripheral gate pattern is formed in the peripheral circuit region to be aligned with the mask patterns. Planarization insulating patterns are formed between the second cell gate pattern and the peripheral gate pattern, and around the peripheral gate pattern.

In selected embodiments of the present invention, the methods may further include forming isolation regions defining a cell active region of the cell array region and a peripheral active region of the peripheral circuit region. The first and second cell gate patterns may be respectively disposed on the cell active region and the isolation regions. The first cell gate pattern may be formed to have a lower cell gate electrode, an upper cell gate electrode, and a cell gate capping pattern, which are sequentially stacked. The second cell gate pattern may be formed to have the other lower cell gate electrode, the other upper cell gate electrode, and the other cell gate capping pattern, which are sequentially stacked. The peripheral gate pattern may be formed to be disposed in the peripheral active region to have a lower peripheral gate electrode, an upper peripheral gate electrode, and a peripheral gate capping pattern, which are sequentially stacked. The preliminary peripheral gate pattern may be formed to be disposed on the isolation regions and the peripheral active region to have a lower peripheral conductive layer, an upper peripheral conductive layer, and a peripheral capping layer, which are sequentially stacked.

In the selected embodiments of the present invention, forming the mask patterns may include sequentially forming a lower mask layer, an intermediate mask layer and an upper mask layer that cover the first cell gate pattern, the preliminary peripheral gate pattern, the buried insulating patterns and the cell spacers, and forming photoresist patterns on the upper mask layer. Here, one of the photoresist patterns may be formed to be disposed in the cell array region to partially cover the preliminary peripheral gate pattern by extending from the first cell gate pattern. The other photoresist pattern may be formed to be disposed in the peripheral circuit region to expose the preliminary peripheral gate pattern.

Forming the mask patterns may further include etching the upper and intermediate mask layers using the photoresist patterns as an etch mask to form upper and intermediate mask patterns, wherein the photoresist patterns are removed from the upper mask patterns while the intermediate mask patterns are formed, and etching the lower mask layer using the upper and intermediate mask patterns as an etch mask to form a lower mask pattern.

In the selected embodiments of the present invention, forming the second cell gate pattern and the peripheral gate pattern may include etching the peripheral capping layer and the upper peripheral conductive layer using the upper, intermediate and lower mask patterns as an etch mask to form the other upper cell gate electrode and the other cell gate capping pattern, which are sequentially stacked, in the cell array region, and to form the upper peripheral gate electrode and the peripheral gate capping pattern, which are sequentially stacked, in the peripheral circuit region.

Meanwhile, the upper and intermediate mask patterns may be removed from the lower mask patterns while the other upper cell gate electrode, the other cell gate capping pattern, the upper peripheral gate electrode and the peripheral gate capping pattern are formed. Also, forming the second cell gate pattern and the peripheral gate pattern may further include etching the lower peripheral conductive layer using the lower mask patterns as an etch mask to form the other lower cell gate electrode and the lower peripheral gate electrode.

In still other embodiments of the present invention, the methods may further include forming peripheral spacers on sidewalls of the selected lower mask pattern and the second cell gate pattern to be disposed in the cell array region, and sidewalls of the other lower mask pattern and the peripheral gate pattern to be disposed in the peripheral circuit region.

In still other embodiments of the present invention, forming the planarization insulating patterns may include forming a planarization insulating layer to cover the peripheral spacers and the lower mask layers and fill between the second cell gate pattern and the peripheral gate pattern, and performing a planarization process on the planarization insulating layer, the lower mask patterns and the peripheral spacers to expose the first and second cell gate patterns, the peripheral gate pattern, and the buried insulating patterns.

In still other embodiments of the present invention, forming the buried insulating patterns may include forming a buried insulating layer to cover the first cell gate pattern and fill between the first cell gate pattern and the preliminary peripheral gate pattern, the preliminary peripheral gate pattern and the cell spacers, and performing a planarization process on the buried insulating layer to expose the first cell gate pattern and the preliminary peripheral gate pattern.

In still other embodiments of the present invention, forming the first cell gate pattern and the preliminary peripheral gate pattern may include sequentially forming a lower conductive layer, an upper conductive layer and a capping layer on the semiconductor substrate, and forming photoresist patterns on the capping layer. Here, one of the photoresist patterns may be formed to be disposed in the cell array region to overlap the first cell gate pattern. Also, the other photoresist pattern may be formed to cover the peripheral circuit region to overlap the preliminary peripheral gate pattern.

In addition, forming the first cell gate pattern and the preliminary peripheral gate pattern may further include sequentially etching the capping layer, the upper conductive layer and the lower conductive layer using the photoresist patterns as an etch mask, and removing the photoresist patterns from the semiconductor substrate.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF EMBODIMENTS OF THE INVENTION

Figure 1:
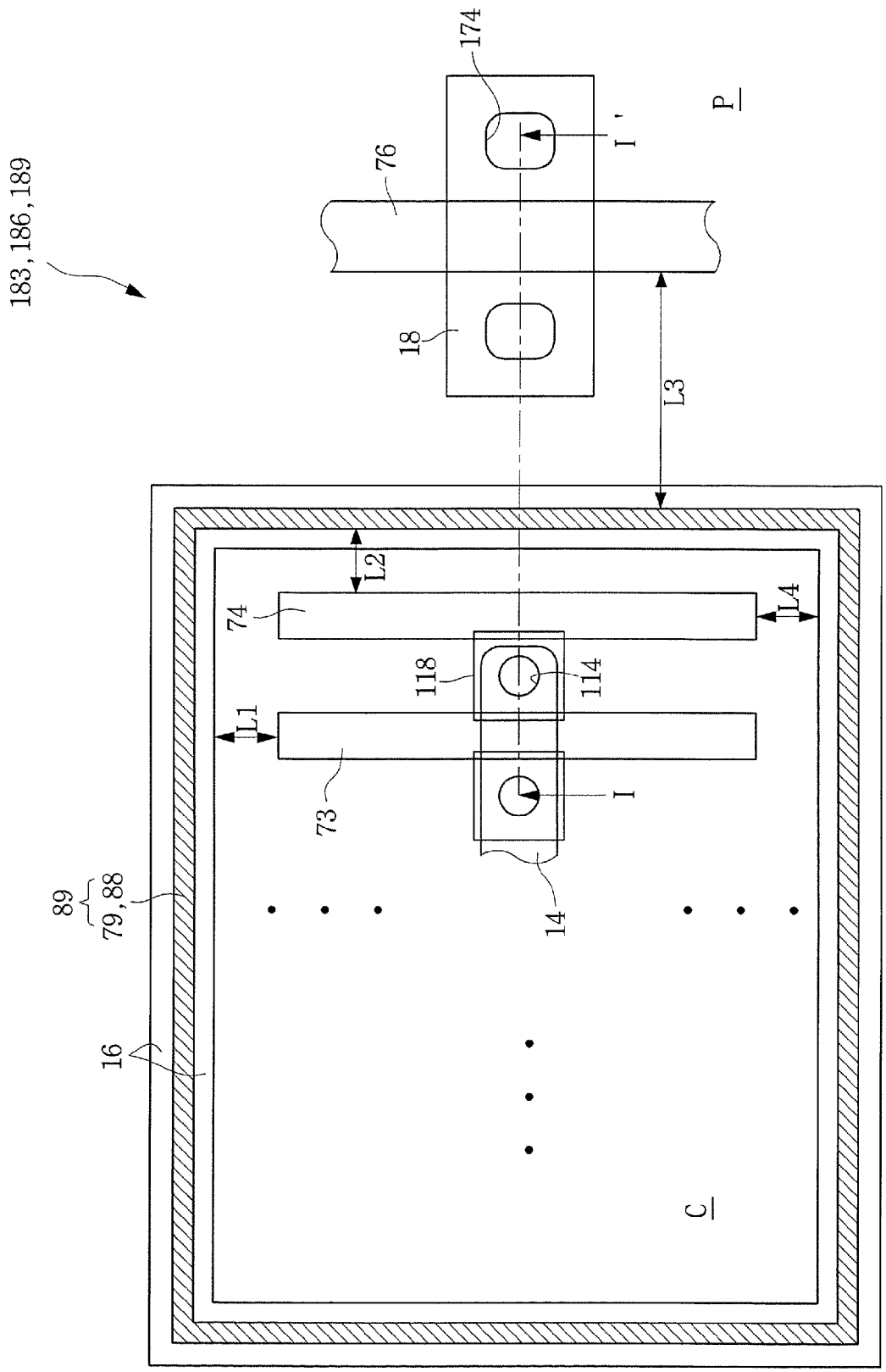
FIG. 1 is a layout showing a semiconductor device according to exemplary embodiments of the present invention.

The present invention is described more fully hereinafter with reference to the accompanying drawings, in which example embodiments of the invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to," "coupled to" or "responsive to" another element or layer, it can be directly on, connected, coupled or responsive to the other element or layer or intervening elements or layers may be present. In contrast, when an element is referred to as being "directly on," "directly connected to," "directly coupled to" or "directly responsive to" another element or layer, there are no intervening elements or layers present. Like numbers refer to like elements throughout. As used herein, the term "and/or" includes any and all combinations (mixtures) of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The structure and/or the device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

It should also be noted that in some alternate implementations, the functionality of a given block may be separated into multiple blocks and/or the functionality of two or more blocks may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Next, semiconductor devices according to embodiments of the present invention will be described below with reference to the accompanying drawings.

Figure 2:
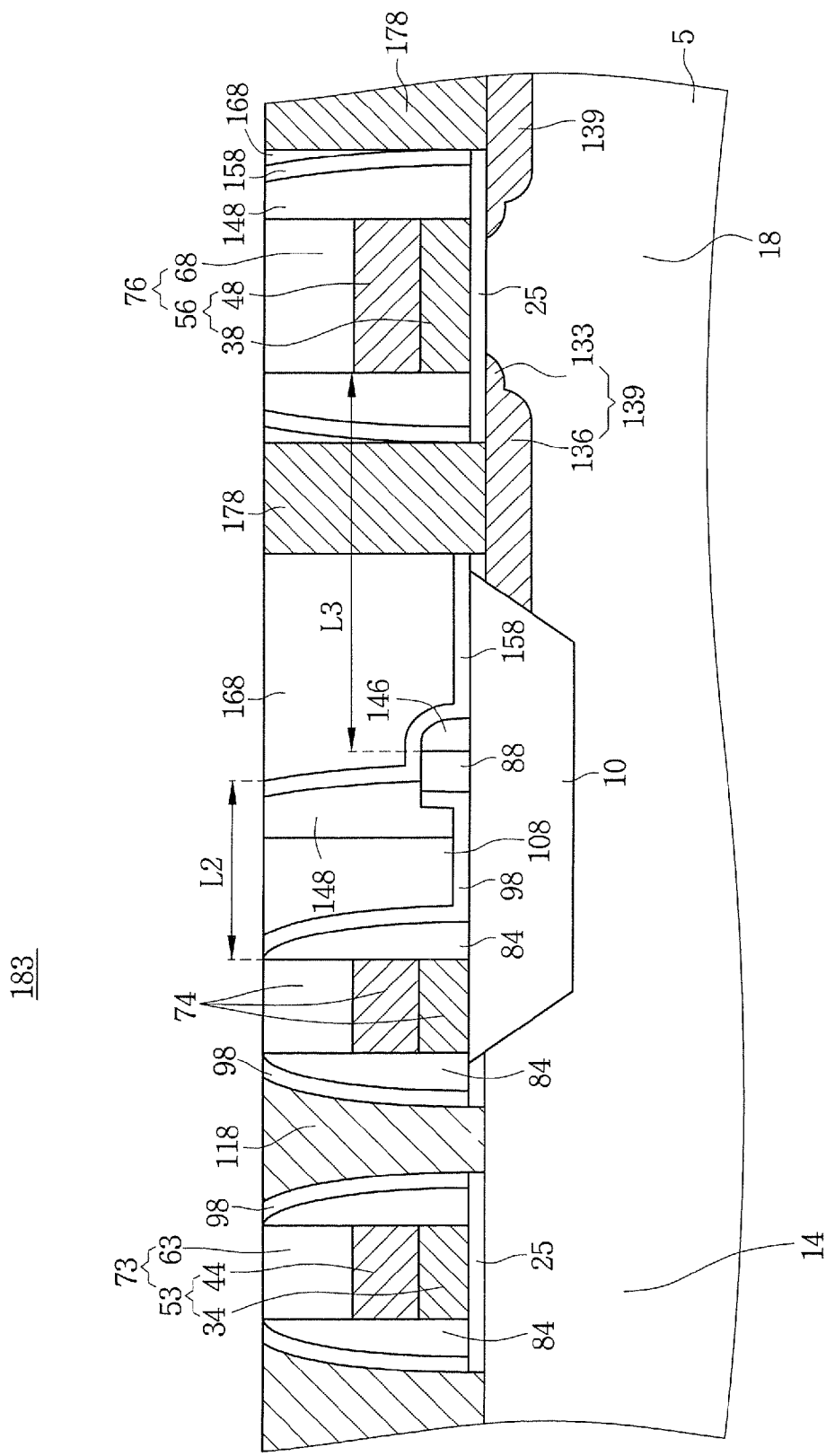
FIG. 2 is a cross-sectional view taken along line I-I' of FIG. 1, showing a semiconductor device according to exemplary embodiments of the present invention.
Figure 14:
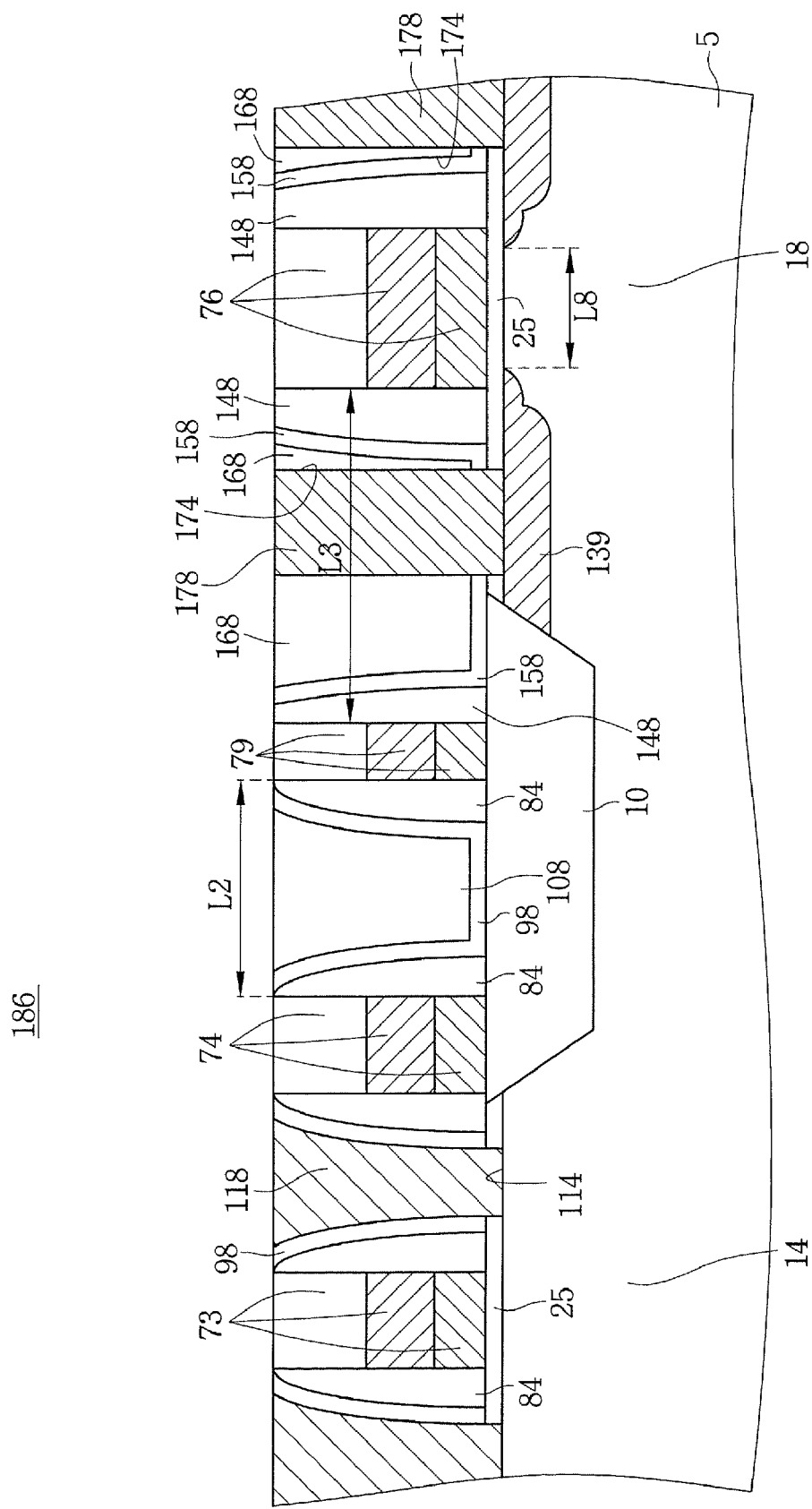
Figure 16:
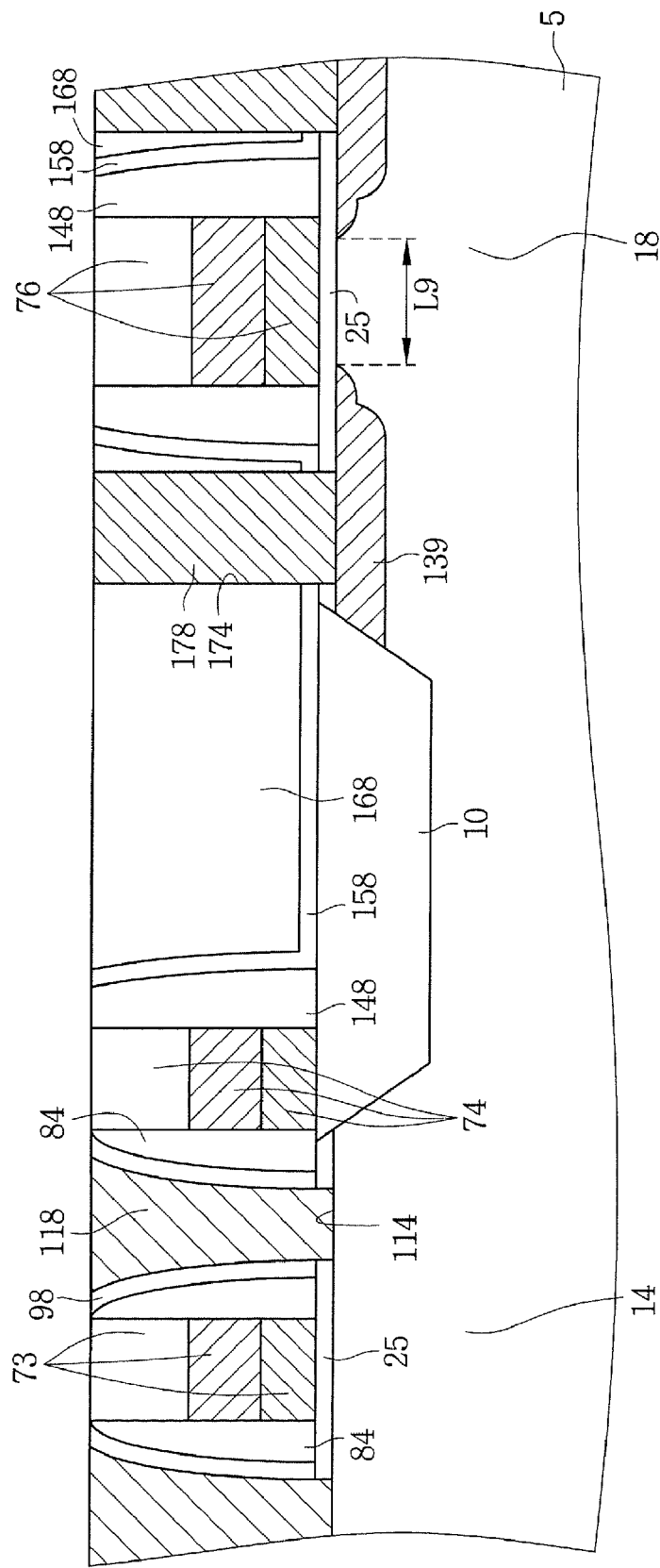

FIG. 1 is a layout showing a semiconductor device according to exemplary embodiments of the present invention, and FIGS. 2, 14 and 16 are cross-sectional views taken along line I-I' of FIG. 1, showing the semiconductor device according to exemplary embodiments of the present invention. Like reference numerals designate like elements in FIGS. 2, 14 and 16.

Referring to FIGS. 1, 2, 14 and 16, each of semiconductor devices 183, 186 and 189 according to the present invention includes a semiconductor substrate 5 having a cell array region C and a peripheral circuit region P as shown in FIG. 1. The semiconductor substrate 5 has conductivity. The cell array region C is surrounded by the peripheral circuit region P. The peripheral circuit region P may have a different conductivity than the cell array region C. The peripheral circuit region P may have the same conductivity as the cell array region C. The semiconductor devices 183, 186 and 189 may be a volatile memory device or a non-volatile memory device. The cell array region C may have cell gate patterns that are in the same shape along rows and columns, which may be disposed on the semiconductor substrate 5. The peripheral circuit region P may have peripheral gate patterns that are regularly disposed on a part of the semiconductor substrate 5 and irregularly disposed on the semiconductor substrate 5 as a whole to correspond to a semiconductor circuit design.

For ease of illustration, only first and second cell gate patterns 73 and 74 that are disposed in the cell array region C and a selected peripheral gate pattern 76 disposed in the peripheral circuit region P are shown in FIG. 1. According to exemplary embodiments of the present invention, the first and second cell gate patterns 73 and 74 may be sequentially arranged outwardly from a center of the cell array region C. The respective first and second cell gate patterns 73 and 74 may have a cell gate 53 and a cell gate capping pattern 63, which are sequentially stacked, as shown in FIGS. 2, 14 and 16. Here, the cell gate 53 may have a lower cell gate electrode 34 and an upper cell gate electrode 44, which are sequentially stacked. The peripheral gate pattern 76 may have a peripheral gate 56 and a peripheral gate capping pattern 68, which are sequentially stacked, as shown in FIGS. 2, 14 and 16. Here, the peripheral gate 56 may have a lower peripheral gate electrode 38 and an upper peripheral gate electrode 48. The peripheral gate capping pattern 68 may be formed of the same insulating material as the cell gate capping pattern 63 such as silicon nitride or silicon oxynitride. The upper peripheral gate electrode 48 may be formed of the same conductive material as the upper cell gate electrode 44 such as metal, metal silicide or metal compositions. The lower peripheral gate electrode 38 may be formed of the same conductive material as the lower cell gate electrode 34 such as silicon, silicide or silicon-containing materials.

Figure 12:
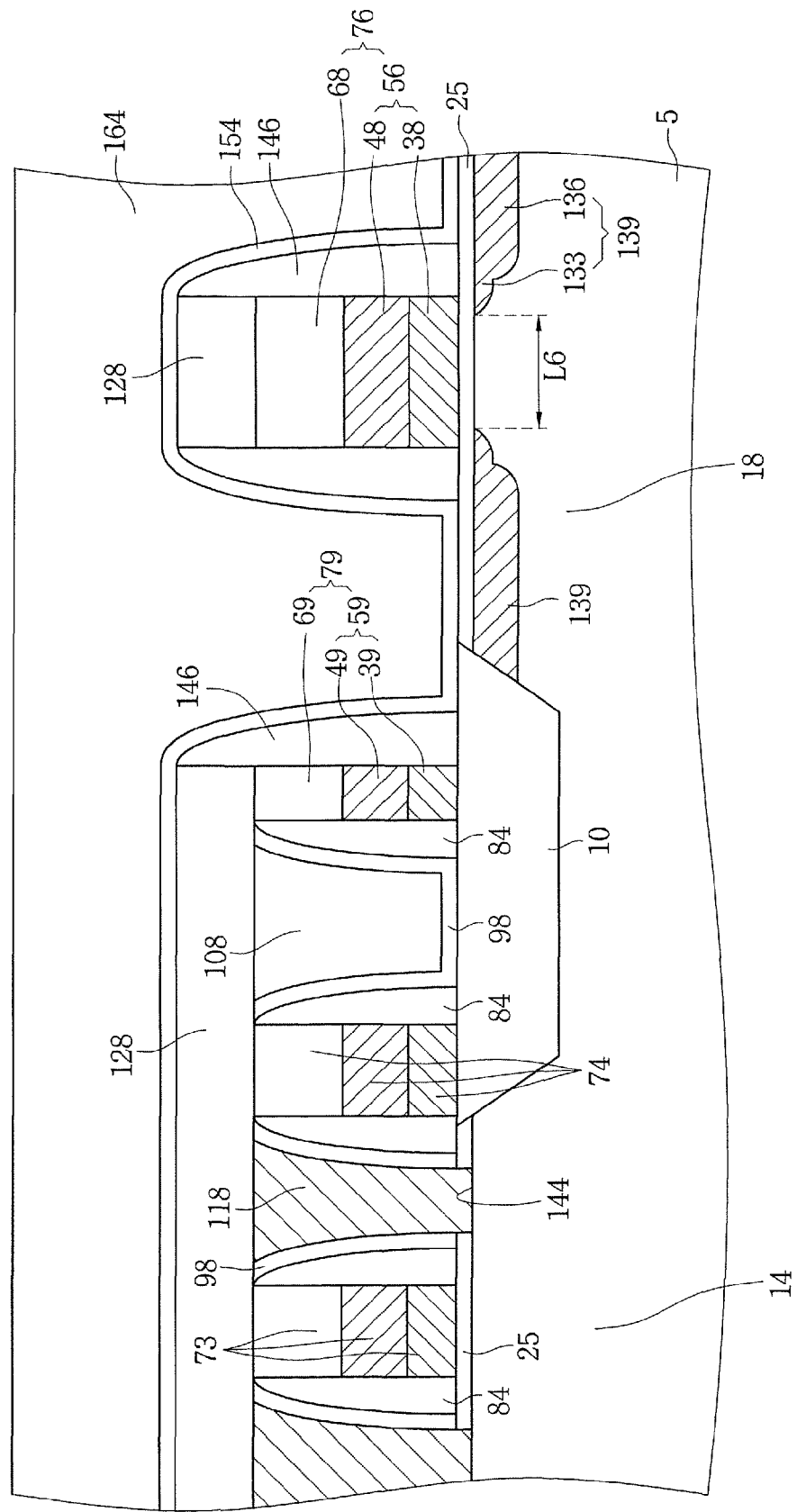

According to exemplary embodiments of the present invention, a defining pattern 89 is disposed between the cell array region C and the peripheral circuit region P, as shown in FIG. 1. The defining pattern 89 may be disposed to surround the cell array region C. According to selected exemplary embodiments of the present invention, the defining pattern 89 may be a cell space pattern 88, as shown in FIG. 2. The cell space pattern 88 may be the same material as the cell gate capping pattern 63. An upper surface of the cell space pattern 88 may be disposed at a lower level than upper surfaces of the first and second cell gate patterns 73 and 74 and the peripheral gate pattern 76. According to other exemplary embodiments of the present invention, the defining pattern 89 may be a dummy gate pattern 79 disposed between the cell array region C and the peripheral circuit region P as shown in FIG. 14. The dummy gate pattern 79 may have a lower dummy gate 39, an upper dummy gate 49 and a dummy capping pattern 69, which are sequentially stacked, as shown in FIG. 12. An upper surface of the dummy gate pattern 79 may be disposed at the same level as the upper surfaces of the first and second cell gate patterns 73 and 74 and the peripheral gate pattern 76. According to still other exemplary embodiments of the present invention, the defining pattern 89 may not be disposed between the cell array region C and the peripheral circuit region P, as shown in FIG. 16.

Referring back to FIGS. 1, 2, 14 and 16, according to exemplary embodiments of the present invention, buried insulating patterns 108 are disposed around the defined pattern 89 in the cell array region C, as shown in FIGS. 2, 14 and 16. The buried insulating pattern 108 may be formed of a silicon oxide layer that is easily transformed by a semiconductor annealing process or has a chemically and physically stable material structure through the semiconductor annealing process. The buried insulating pattern 108 may be an insulating layer in which a metal atom and/or a non-metal atom are inserted into a silicon oxide lattice to be easily transformed through the semiconductor annealing process or to have a chemically and physically stable material structure through the semiconductor annealing process. According to selected exemplary embodiments of the present invention, a part of the buried insulating patterns 108 may be disposed around the first cell gate pattern 73, and between the first and second cell gate patterns 73 and 74 along one sidewall of the defining pattern 89 in view of FIGS. 1 and 2. The other buried insulating pattern 108 may be disposed between the second cell gate pattern 74 and the cell space pattern 88 along the other sidewall of the defining pattern 89 as shown in FIG. 2. The other buried insulating pattern 108 may be disposed along the cell space pattern 88 to face the cell array region C. Upper surfaces of the other buried insulating pattern 108 may be disposed at a higher level than an upper surface of the cell space pattern 88.

According to other exemplary embodiments of the present invention, a part of the buried insulating patterns 108 may be disposed around the first cell gate pattern 73, and between the first and second cell gate patterns 73 and 74 along the one sidewall of the defining pattern 89 in view of FIGS. 1 and 14. The other buried insulating pattern 108 may be disposed between the second cell gate pattern 74 and the dummy gate pattern 79 along the other sidewall of the defining pattern 89 as shown in FIG. 14. The other buried insulating pattern 108 may be disposed along the dummy gate pattern 79 to face the cell array region C. Upper surfaces of the other buried insulating pattern 108 may be disposed at the same level as an upper surface of the dummy gate pattern 79. According to still other exemplary embodiments of the present invention, the buried insulating patterns 108 may be disposed around the first cell gate pattern 73, and between the first and second cell gate patterns 73 and 74 along the one sidewall of the defining pattern 89 in view of FIGS. 1 and 16. The buried insulating patterns 108 may not be disposed adjacent to the second cell gate pattern 74 along the other sidewall of the defining pattern 89 as shown in FIG. 16.

According to exemplary embodiments of the present invention, planarization insulating patterns 168 are disposed in the peripheral circuit region P, as shown in FIGS. 2, 14 and 16. The planarization insulating patterns 168 may be a silicon oxide layer, or an insulating layer in which a metal atom and/or a non-metal atom are inserted into a silicon oxide lattice. According to selected exemplary embodiments of the present invention, the planarization insulating patterns 168 may be disposed around the peripheral gate pattern 76 and between the peripheral gate pattern 76 and the cell space pattern 88, as shown in FIG. 2. The planarization insulating patterns 168 between the cell space pattern 88 and the peripheral gate pattern 76 may be disposed along the cell space pattern 88 to face the peripheral circuit region P. The upper surface of the planarization insulating patterns 168 between the cell space pattern 88 and the peripheral gate pattern 76 may be disposed at a higher level than an upper surface of the cell space pattern 88.

According to other exemplary embodiments of the present invention, the planarization insulating patterns 168 may be disposed around the peripheral gate patterns 76, and between the peripheral gate pattern 76 and the dummy gate pattern 79, as shown in FIG. 14. The planarization insulating patterns 168 between the peripheral gate pattern 76 and the dummy gate pattern 79 may be disposed along the dummy gate pattern 79 to face the peripheral circuit region P. The upper surface of the planarization insulating patterns 168 between the dummy gate pattern 79 and the peripheral gate pattern 76 may be disposed at substantially the same level as an upper surface of the dummy gate pattern 79. According to still other exemplary embodiments of the present invention, the planarization insulating patterns 168 may be disposed around the peripheral gate patterns 76, and between the peripheral gate pattern 76 and the second cell gate pattern 74, as shown in FIG. 16. The planarization insulating patterns 168 between the peripheral gate pattern 76 and the second cell gate pattern 74 may be disposed to surround the cell array region C. The upper surface of the planarization insulating patterns 168 between the peripheral gate pattern 76 and the second cell gate pattern 74 may be disposed at the same level as upper surfaces of the first and second cell gate patterns 73 and 74 and the peripheral gate pattern 76.

According to exemplary embodiments of the present invention, a isolation region 10 may be disposed in the cell array region C and the peripheral circuit region P, as shown in FIGS. 2, 14 and 16. The isolation region 10 may be at least one insulating layer. The isolation region 10 may define a cell active region 14 of the cell array region C and a peripheral active region 18 of the peripheral circuit region P. According to selected exemplary embodiments of the present invention, the first cell gate pattern 73 may be disposed on the cell active region 14, the second cell gate pattern 74 and the cell space pattern 88 may be disposed on the isolation region 10, and the peripheral gate pattern 76 may be disposed on the peripheral active region 18, as shown in FIG. 2. As a modification of the selected exemplary embodiments of the present invention, the isolation region 10 may define the cell active region 14 of the cell array region C, the peripheral active region 18 of the peripheral circuit region P, and a dummy active region 16 between the cell array region C and the peripheral circuit region P. The dummy active region 16 may be disposed below the cell space pattern 88 to define the cell array region C, as shown in FIG. 1.

According to exemplary embodiments of the present invention, a distance between the first cell gate pattern 73 and the dummy active region 16 may be formed to have a predetermined length L1 along a major axis of the first cell gate pattern 73, as shown in FIG. 1. A distance between the second cell gate pattern 74 and the dummy active region 16 may be formed to have the predetermined length L1 along a major axis of the second cell gate pattern 74, as shown in FIG. 1. A distance between the second cell gate pattern 74 and the defining pattern 89, and a distance between the defining pattern 89 and the peripheral gate pattern 76 may be formed to respectively have predetermined lengths L2 and L3 along a minor axis of the second cell gate pattern 74, as shown in FIG. 1. A distance between the first cell gate pattern 73 and the defining pattern 89 may be formed to have a predetermined length L4 along a major axis of the first cell gate pattern 73, as shown in FIG. 1. A distance between the second cell gate pattern 74 and the defining pattern 89 may be formed to have the predetermined length L4 along a major axis of the second cell gate pattern 74, as shown in FIG. 1. The defining pattern 89 may be the cell space pattern 88 according to selected exemplary embodiments of the present invention or the dummy gate pattern 79 according to other exemplary embodiments of the present invention.

According to other exemplary embodiments of the present invention, the first cell gate pattern 73 may be disposed on the cell active region 14, the second cell gate pattern 74 and the dummy gate pattern 79 may be disposed on the isolation region 10, and the peripheral gate pattern 76 may be disposed on the peripheral active region 18, as shown in FIG. 14. As a modification of other exemplary embodiments of the present invention, the isolation region 10 may define the cell active region 14 of the cell array region C, the peripheral active region 18 of the peripheral circuit region P, and the dummy active region 16 between the cell array region C and the peripheral circuit region P. The dummy active region 16 may be disposed below the dummy gate pattern 79 to define the cell array region C, as shown in FIG. 1. According to still other exemplary embodiments of the present invention, the first cell gate pattern 73 may be disposed on the cell active region 14, the second cell gate pattern 74 may be disposed on the isolation region 10, and the peripheral gate pattern 76 may be disposed on the peripheral active region 18, as shown in FIG. 16. As a modification of still other exemplary embodiments of the present invention, the isolation region 10 may define the cell active region 14 of the cell array region C, the peripheral active region 18 of the peripheral circuit region P, and the dummy active region 16 between the cell array region C and the peripheral circuit region P. The dummy active region 16 may be disposed to define the cell array region C, as shown in FIG. 1.

Referring back to FIGS. 1, 2, 14 and 16, according to exemplary embodiments of the present invention, cell spacers 84 and peripheral spacer patterns 148 are disposed in the cell array region C and the peripheral circuit region P. The peripheral spacer patterns 148 may be formed of the same material as the cell spacers 84. According to selected exemplary embodiments of the present invention, the cell spacers 84 may be disposed on sidewalls of the first and second cell gate patterns 73 and 74, as shown in FIG. 2. One of the peripheral spacer patterns 148 may be disposed on the cell space pattern 88 between the buried insulating pattern 108 and the planarization insulating pattern 168 in the cell array region C. The other peripheral spacer patterns 148 may be disposed on sidewalls of the peripheral gate pattern 76.

According to other exemplary embodiments of the present invention, the cell spacers 84 may be disposed on the sidewalls of the first and second cell gate patterns 73 and 74, and on one sidewall of the dummy gate pattern 79, as shown in FIG. 14. One of the peripheral spacer patterns 148 may be disposed on the other sidewall of the dummy gate pattern 79. The other peripheral spacer patterns 148 may be disposed on the sidewalls of the peripheral gate pattern 76. According to still other exemplary embodiments of the present invention, the cell spacers 84 may be disposed on both sidewalls of the first cell gate patterns 73 and on one sidewall of the second cell gate pattern 74, as shown in FIG. 16. Also, one of the peripheral spacer patterns 148 may be disposed on the other sidewall of the second cell gate pattern 74. The other peripheral spacer patterns 148 may be disposed on the sidewalls of the peripheral gate pattern 76.

According to exemplary embodiments of the present invention, cell etch buffer patterns 98 may be disposed in the cell array region C, and peripheral etch buffer patterns 158 may be disposed in the peripheral circuit region P, as shown in FIGS. 2, 14 and 16. The cell etch buffer patterns 98 and the peripheral etch buffer patterns 158 may be formed of the same material as the cell spacers 84. According to selected exemplary embodiments of the present invention, the cell etch buffer patterns 98 may be disposed on the cell spacers 84, and between the second cell gate pattern 74 and the cell space pattern 88, as shown in FIG. 2. The cell etch buffer patterns 98 between the second cell gate pattern 74 and the cell space pattern 88 may be disposed below the buried insulating pattern 108 and the peripheral spacer pattern 148. In the peripheral circuit region P, the peripheral etch buffer patterns 158 may be disposed between one sidewall of the peripheral gate pattern 76 and the cell space pattern 88, and between the other sidewall of the peripheral gate pattern 76 and the planarization insulating pattern 168. The peripheral etch buffer pattern 158 between the one sidewall of the peripheral gate pattern 76 and the cell space pattern 88 may be in contact with the peripheral spacer pattern 148 between the buried insulating pattern 108 and the planarization insulating pattern 168 to be disposed below the planarization insulating pattern 168.

According to other exemplary embodiments of the present invention, the cell etch buffer patterns 98 may be disposed on the cell spacers 84, and between the second cell gate pattern 74 and the dummy gate pattern 79, as shown in FIG. 14. The cell etch buffer pattern 98 between the second cell gate pattern 74 and the dummy gate pattern 79 may be disposed below the buried insulating pattern 108. In the peripheral circuit region P, the peripheral etch buffer patterns 158 may be disposed between one sidewall of the peripheral gate pattern 76 and the dummy gate pattern 79, and between the other sidewall of the peripheral gate pattern 76 and the planarization insulating pattern 168. The peripheral etch buffer pattern 158 between the one sidewall of the peripheral gate pattern 76 and the dummy gate pattern 79 may be disposed below the planarization insulating pattern 168.

According to still other exemplary embodiments of the present invention, the cell etch buffer patterns 98 may be disposed on the cell spacers 84 of the first cell gate pattern 73 and on the cell spacer 84 of one sidewall of the second cell gate pattern 74, as shown in FIG. 16. In the peripheral circuit region P, the peripheral etch buffer patterns 158 may be disposed between the other sidewall of the second cell gate pattern 74 and one sidewall of the peripheral gate pattern 76, and between the other sidewall of the peripheral gate pattern 76 and the planarization insulating pattern 168. The peripheral etch buffer pattern 158 between the other sidewall of the second cell gate pattern 74 and the one sidewall of the peripheral gate pattern 76 may be disposed below the planarization insulating patterns 168.

Again referring back to FIGS. 1, 2, 14 and 16, according to exemplary embodiments of the present invention, a gate insulating layer 25 may be disposed in the cell array region C and the peripheral circuit region P, as shown in FIGS. 2, 14 and 16. The gate insulating layer 25 may be disposed below the first and second cell gate patterns 73 and 74 and the peripheral gate pattern 76. Impurity diffusion regions 139 may be disposed in the semiconductor substrate 5 to overlap the peripheral gate pattern 76. Each of the impurity diffusion regions 139 may have a low-concentration impurity diffusion region 133 and a high-concentration impurity diffusion region 136, as shown in FIG. 2. The impurity diffusion regions 139 may have a lightly doped drain (LDD) structure. The impurity diffusion regions 139 may have the same conductivity as the semiconductor substrate 5 or different conductivity from the semiconductor substrate 5.

According to exemplary embodiments of the present invention, cell gate electrical nodes 118 may be disposed around the first and second cell gate patterns 73 and 74, and peripheral gate electrical nodes 178 may be disposed around the peripheral gate pattern 76, as shown in FIGS. 2, 14 and 16. The cell gate electrical nodes 118 may be disposed in the buried insulating patterns 108, the cell etch buffer patterns 98, and the gate insulating layer 25 in the cell array region C. Also, the peripheral gate electrical nodes 178 may be disposed in the planarization insulating patterns 168, the peripheral etch buffer patterns 158, and the gate insulating layer 25 in the peripheral circuit region P. The cell gate electrical nodes 118 and the peripheral gate electrical nodes 178 may be conductive material. The cell gate electrical nodes 118 may be disposed to be in contact with the cell active region 14. The peripheral gate electrical nodes 178 may be disposed to be in contact with the impurity diffusion regions 139 of the peripheral active region 18.

Next, methods of forming a semiconductor device according to embodiments of the present invention will be described below.

FIGS. 3 to 6 are cross-sectional views taken along line I-I' of FIG. 1, illustrating a method of forming a semiconductor device according to exemplary embodiments of the present invention.

Figure 3:
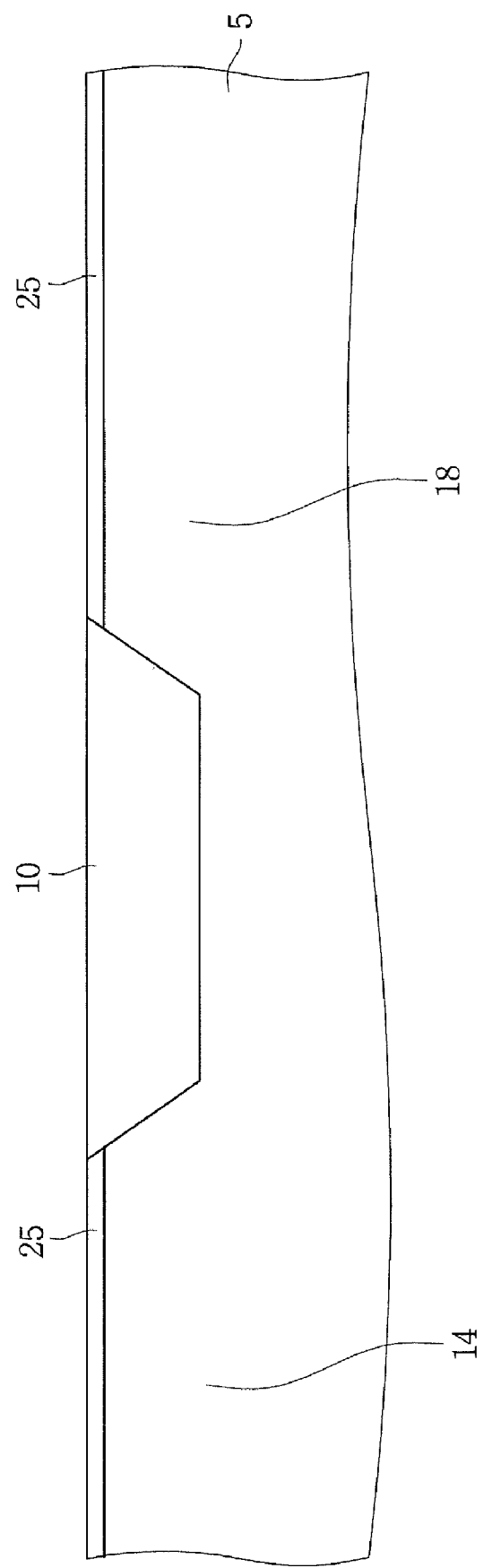
FIGS. 3 to 6 are cross-sectional views taken along line I-I' of FIG. 1, illustrating a method of forming a semiconductor device according to exemplary embodiments of the present invention.
Figure 4:
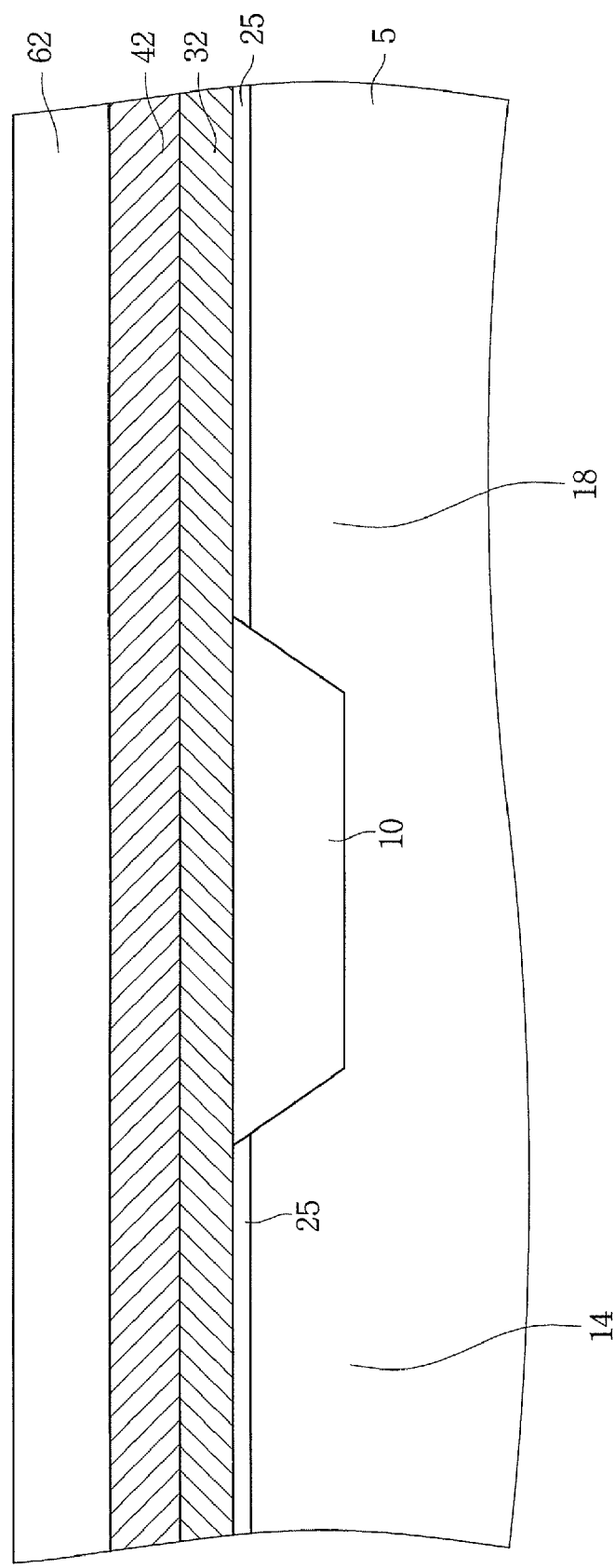

Referring to FIGS. 1, 3 and 4, according to exemplary embodiments of the present invention, a semiconductor substrate 5 having the cell array region C and the peripheral circuit region P of FIG. 1 is prepared, as shown in FIG. 3. The semiconductor substrate 5 has conductivity. A isolation region 10 is formed in the semiconductor substrate 5, as shown in FIG. 3. The isolation region 10 may be formed in the cell array region C and the peripheral circuit region P. Here, the isolation region 10 may be formed to define a cell active region 14 of the cell array region C and a peripheral active region 18 of the peripheral circuit region P. As a modification of exemplary embodiments of the present invention, the isolation region 10 may define the cell active region 14 of the cell array region C, the peripheral active region 18 of the peripheral circuit region P. and the dummy active region 16 of FIG. 1. The isolation region 10 may be formed of at least one insulating layer.

According to exemplary embodiments of the present invention, a gate insulating layer 25 may be formed in the cell array region C and the peripheral circuit region P. The gate insulating layer 25 may be formed of silicon oxide. The gate insulating layer 25 may be formed of an insulating material, in which a metal atom and/or a non-metal atom are inserted into a silicon oxide lattice. Here, the gate insulating layer 25 may be formed on the cell active region 14 and the peripheral active region 18. A lower conductive layer 32, an upper conductive layer 42 and a capping layer 62 are sequentially formed in the cell array region C and the peripheral circuit region P, as shown in FIG. 4. The lower conductive layer 32 may be formed to cover the isolation region 10, the cell active region 14, and the peripheral active region 18. The lower conductive layer 32 may be a doped polysilicon layer. The upper conductive layer 42 may be a metal silicide layer or at least one metal layer. The capping layer 62 may be an insulating layer containing silicon oxide and/or nitride.

As a modification of exemplary embodiments of the present invention, the gate insulating layer 25 may be formed on the cell active region 14, the dummy active region 16, and the peripheral active region 18. Also, the lower conductive layer 32, the upper conductive layer 42 and the capping layer 62 may be sequentially formed on the cell active region 14, the dummy active region 16, and the peripheral active region 18.

Figure 5:
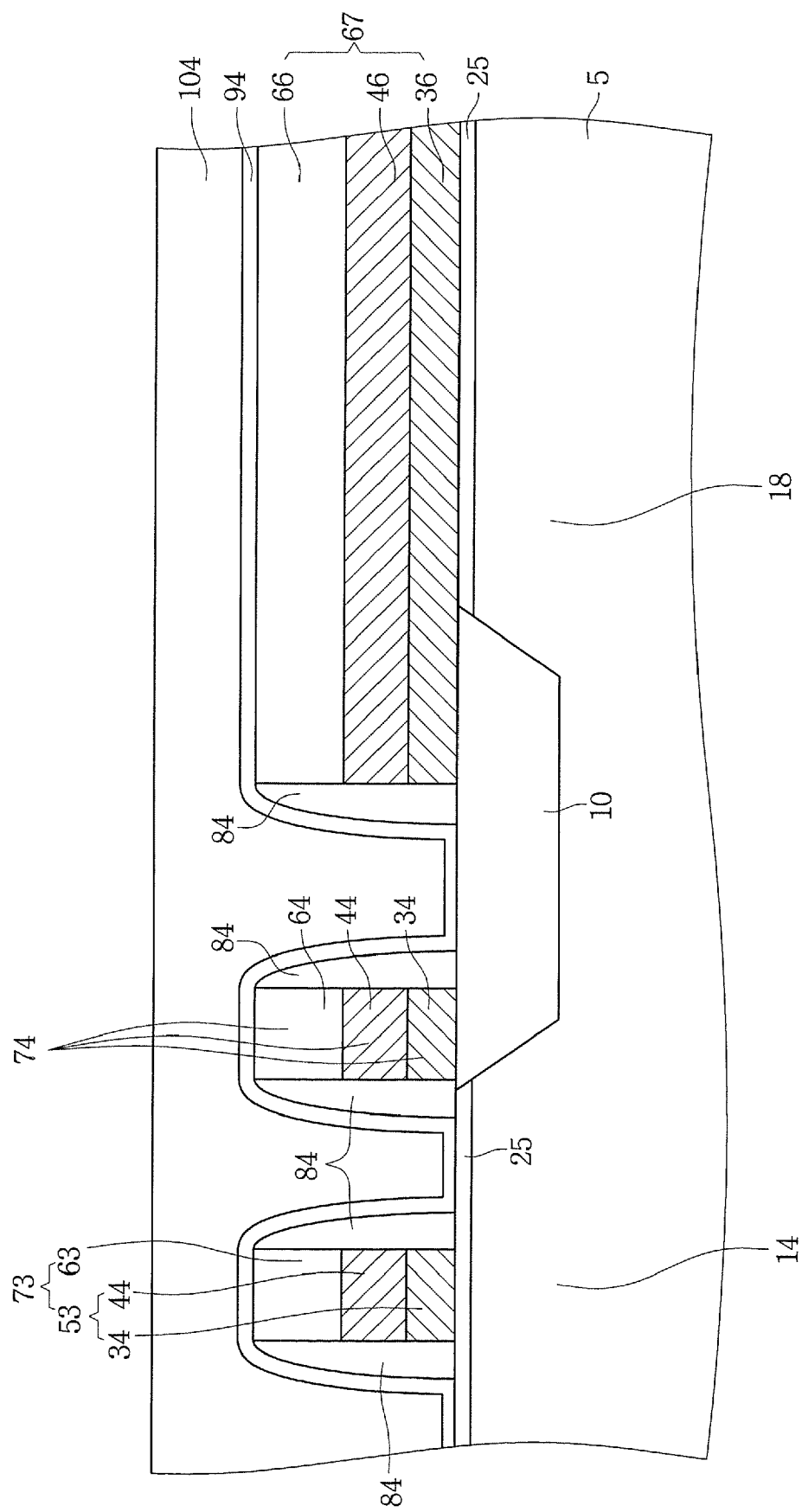

Referring to FIGS. 1 and 5, according to exemplary embodiments of the present invention, photoresist patterns are formed on the capping layer 62 of FIG. 4. The photoresist patterns may be formed using a semiconductor photolithography process well-known to one of ordinary skill in the art. A part of the photoresist patterns may be disposed in the cell array region C to be in the same form along the cell active region 14. The other photoresist patterns may be disposed in the peripheral circuit region P to surround the cell array region C. The capping layer 62, the upper conductive layer 42, and the lower conductive layer 32 are sequentially etched using the photoresist patterns as an etch mask to form the first and second cell gate patterns 73 and 74 of FIGS. 1 and 5 in the cell array region C, and a preliminary peripheral gate pattern 67 of FIG. 5 in the peripheral circuit region P.

Each of the first and second cell gate patterns 73 and 74 may be formed to have a cell gate 53 and a cell gate capping pattern 63, which are sequentially stacked, as shown in FIG. 5. The cell gate 53 may be formed to have a lower cell gate electrode 34 and an upper cell gate electrode 44, which are sequentially stacked. The first cell gate pattern 73 may be disposed in the cell active region 14. The second cell gate pattern 74 may be disposed on the isolation region 10. The preliminary peripheral gate pattern 67 may be formed to have a lower peripheral conductive layer 36, an upper peripheral conductive layer 46, and a peripheral capping layer 66, which are sequentially stacked, as shown in FIG. 5. The preliminary peripheral gate pattern 67 may be disposed on the isolation region 10 by extending from the peripheral active region 18 to be adjacent to the second cell gate pattern 74.

According to exemplary embodiments of the present invention, after the formation of the first and second cell gate patterns 73 and 74, the photoresist patterns are removed from the semiconductor substrate 5. Then, cell spacers 84 are formed on sidewalls of the first and second cell gate patterns 73 and 74 and the preliminary peripheral gate pattern 67, as shown in FIG. 5. The cell spacers 84 may be formed of the same material as the capping layer 62 of FIG. 4. Subsequently, a cell etch buffer layer 94 is formed on the isolation region 10, the gate insulating layer 25, and the cell spacers 84 to conformably cover the first and second cell gate patterns 73 and 74 and the preliminary peripheral gate pattern 67, as shown in FIG. 5. The cell etch buffer layer 94 may be formed of the same material as the cell spacers 84. Then, a buried insulating layer 104 is formed on the cell etch buffer layer 94 to cover the cell spacers 84 by filling between the first and second cell gate patterns 73 and 74 and the preliminary peripheral gate pattern 67, as shown in FIG. 5. The buried insulating layer 104 may be formed of a silicon oxide layer that is easily transformed by using a semiconductor annealing process or has a chemically and physically stable material structure through the use of the semiconductor annealing process. The buried insulating layer 104 may be formed of an insulating material in which a metal atom and/or a non-metal atom are inserted into a silicon oxide lattice to be easily transformed through the use of the semiconductor annealing process or to have a chemically and physically stable material structure through the use of the semiconductor annealing process.

Figure 6:
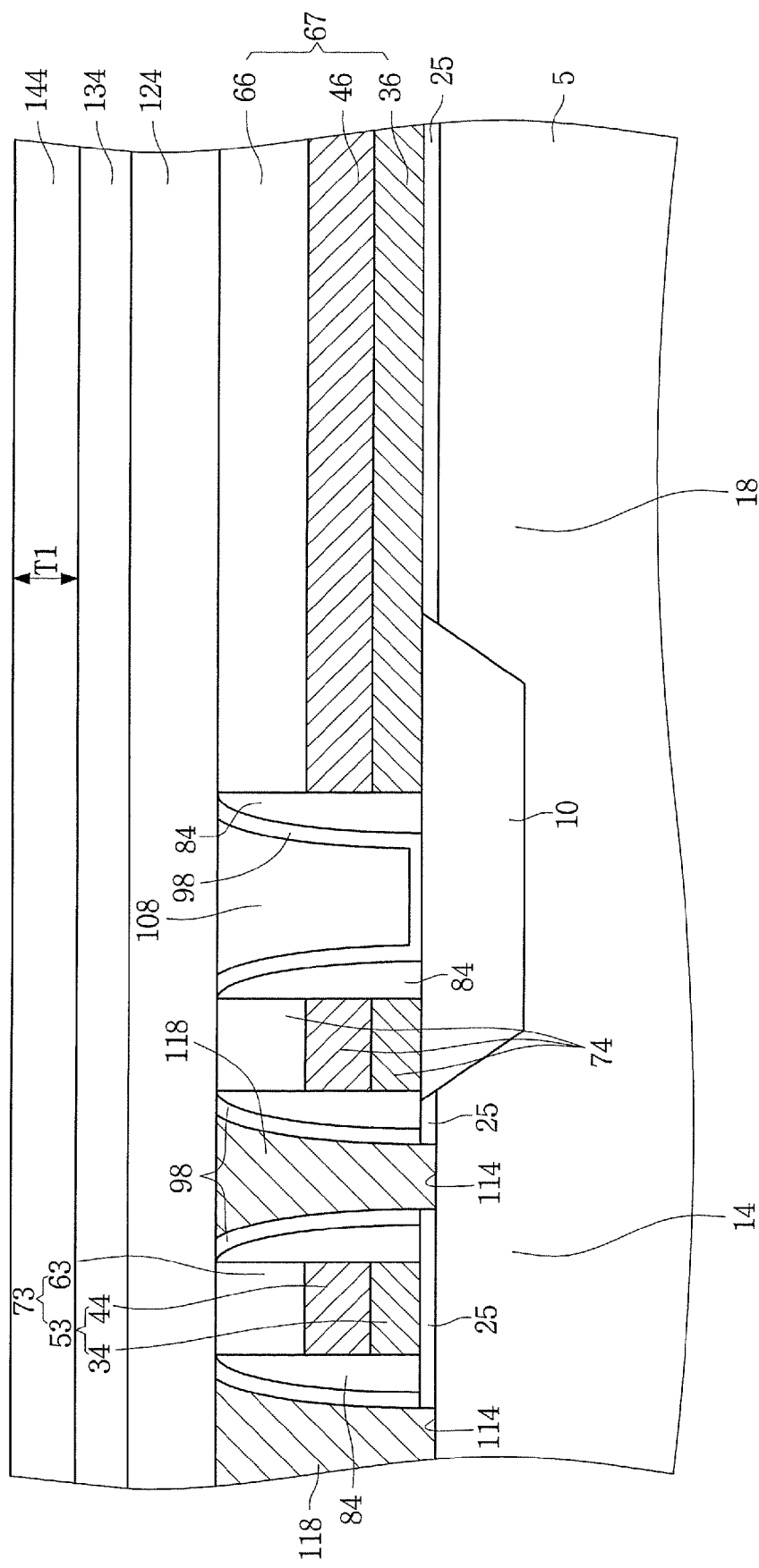

Referring to FIGS. 1 and 6, according to exemplary embodiments of the present invention, a planarization process is performed on the buried insulating layer 104 of FIG. 5. The planarization process is performed until the first and second cell gate patterns 73 and 74 and the preliminary peripheral gate pattern 67 are exposed to form cell etch buffer patterns 98 and buried insulating patterns 108, as shown in FIG. 6. The cell etch buffer patterns 98 and the buried insulating patterns 108 may be formed around the first cell gate pattern 73, and between the first and second cell gate patterns 73 and 74 and the preliminary peripheral gate pattern 67. The planarization process may be performed using a chemical mechanical polishing (CMP) technique or an etching-back technique. Subsequently, cell buried holes 114 may be formed around the first and second cell gate patterns 73 and 74, as shown in FIGS. 1 and 6. The cell buried holes 114 may be disposed in the buried insulating patterns 108, the cell etch buffer patterns 98, and the gate insulating layer 25 to expose the cell active region 14.

According to exemplary embodiments of the present invention, cell gate electrodes 118 are respectively formed in the cell buried holes 114, as shown in FIG. 6. The cell gate electrodes 118 may be formed to fill the cell buried holes 114. The cell gate electrodes 118 may be formed of conductive material. A lower mask layer 124, an intermediate mask layer 134, and an upper mask layer 144 are sequentially formed on the cell etch buffer patterns 98, the buried insulating patterns 108, and the cell gate electrodes 118 to cover the first and second cell gate patterns 73 and 74 and the preliminary peripheral gate pattern 67, as shown in FIG. 6. More specifically, the lower mask layer 124 may be an insulating layer having a different etch rate from the cell etch buffer patterns 98. The lower mask layer 124 may be an insulating layer having the same etch rate as the buried insulating patterns 108. The intermediate mask layer 134 may be an insulating layer having a different etch rate from the lower mask layer 124. The intermediate mask layer 134 may be a carbon layer. The upper mask layer 144 may be an insulating layer having a different etch rate from the intermediate mask layer 134. The upper mask layer 144 may be a silicon oxynitride (SiON) layer.

FIGS. 7, 9, 11 and 13 are cross-sectional views taken along line I-I' of FIG. 1, illustrating a method of forming a semiconductor device according to selected exemplary embodiments of the present invention. Also, FIGS. 8, 10, 12 and 14 are cross-sectional views taken along line I-I' of FIG. 1, illustrating a method of forming a semiconductor device according to other exemplary embodiments of the present invention. Like reference numerals designate like elements throughout FIGS. 7 to 14.

Figure 7:
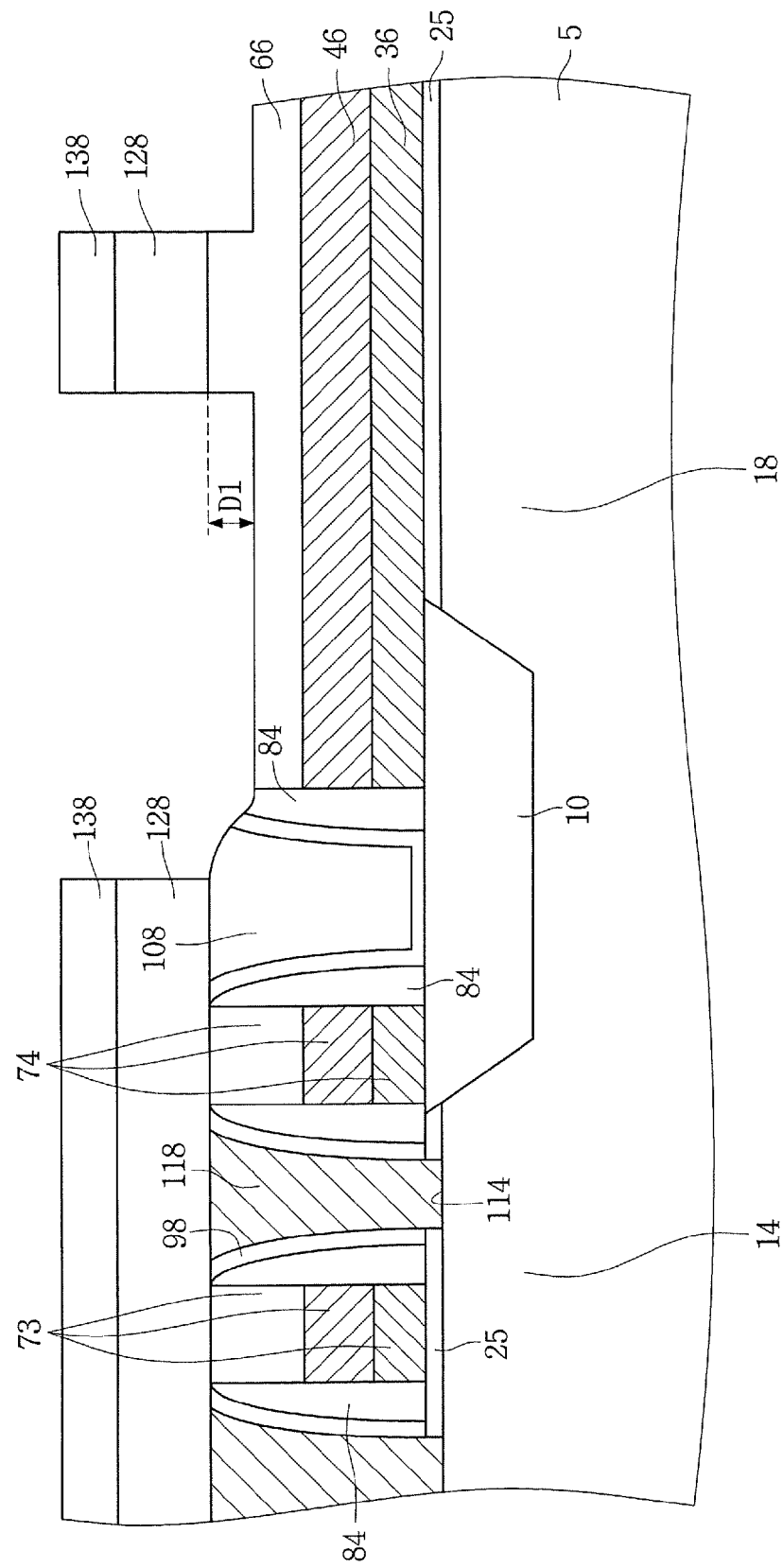
FIGS. 7, 9, 11 and 13 are cross-sectional views taken along line I-I' of FIG. 1, illustrating a method of forming a semiconductor device according to selected exemplary embodiments of the present invention.

Referring to FIGS. 1 and 7, according to selected exemplary embodiments of the present invention, photoresist patterns are formed on the upper mask layer 144 of FIG. 6. The photoresist patterns are formed using a semiconductor photolithography process that is well-known to one of ordinary skill in the art. One of the photoresist patterns may be formed to cover the cell array region C, and its end may be disposed between a second cell gate pattern 74 and a preliminary peripheral gate pattern 67. The other photoresist pattern may be disposed in the peripheral circuit region P to overlap a peripheral active region 18. The upper mask layer 144 and the intermediate mask layer 134 may be sequentially etched using the photoresist patterns as an etch mask to form upper mask patterns (not shown) and intermediate mask patterns 138 of FIG. 7. The photoresist patterns are removed from the upper mask patterns while the intermediate mask patterns 138 are formed. Then, the lower mask layer 124 is etched using the upper mask patterns and the intermediate mask patterns 138 as an etch mask to form lower mask patterns 128, as shown in FIG. 7.

The upper mask patterns, the intermediate mask patterns 138, and the lower mask patterns 128 may be formed to expose the buried insulating pattern 108, the cell etch buffer pattern 98 and the cell spacer 84 between the second cell gate pattern 74 and the preliminary peripheral gate pattern 67, and the preliminary peripheral gate pattern 67. In case that the lower mask layer 124 has the same etch rate as the buried insulating patterns 108, the buried insulating pattern 108 between the second cell gate pattern 74 and the preliminary peripheral gate pattern 67 may be partially removed, as shown in FIG. 7 while the lower mask pattern 128 is formed. Subsequently, a peripheral capping layer 66 is partially etched using the upper mask patterns, the intermediate mask patterns 138, and the lower mask patterns 128 as an etch mask, as shown in FIG. 7. At this time, while the peripheral capping layer 66 is removed from an upper surface thereof by a predetermined depth D1, the cell etch buffer pattern 98 and the cell spacer 84 may be partially removed. Furthermore, the upper mask layer 144 may be etched by a predetermined thickness T1 indicated in FIG. 6 to be removed from the semiconductor substrate 5, as shown in FIG. 7.

Figure 8:
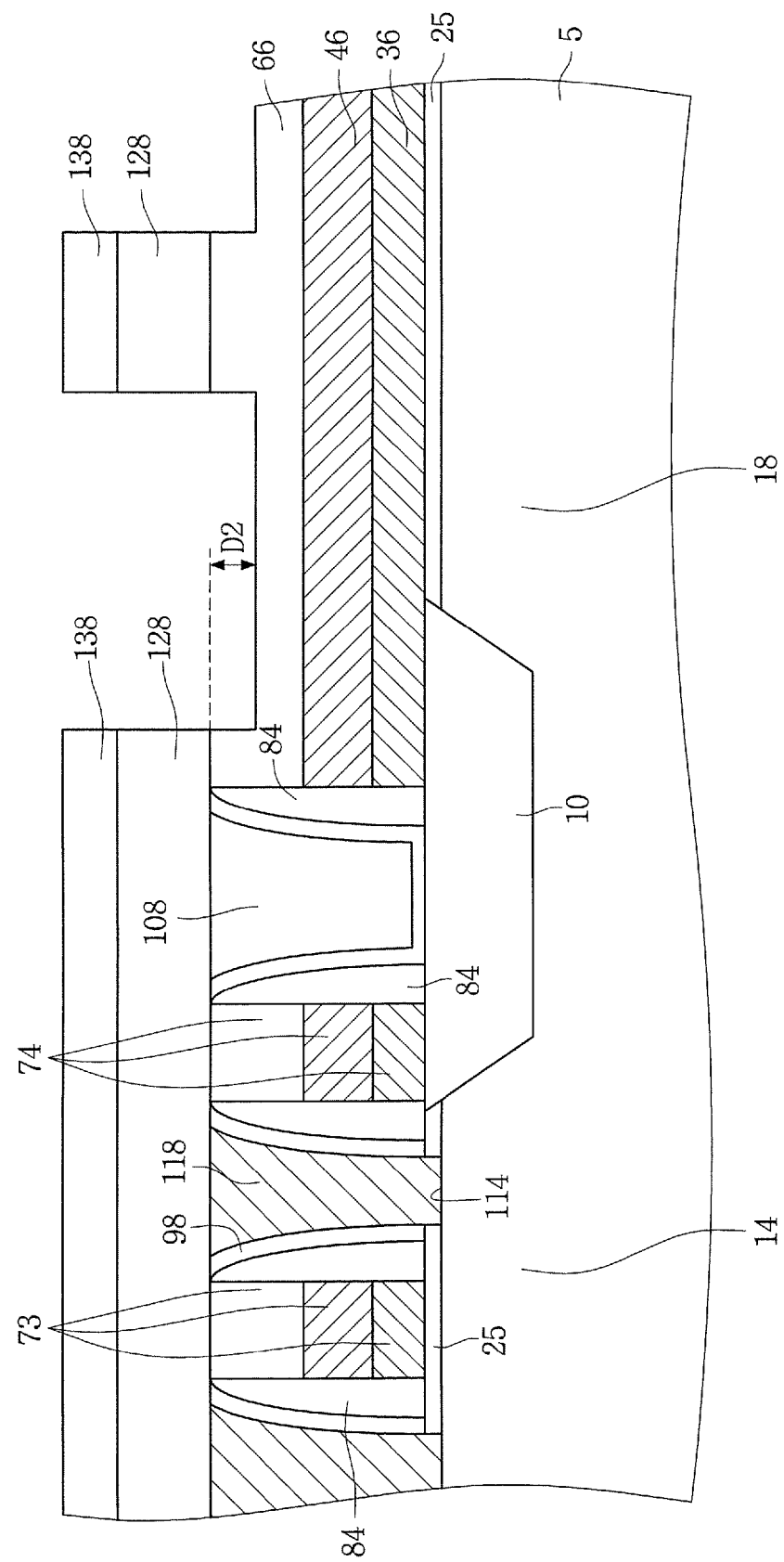
FIGS. 8, 10, 12 and 14 are cross-sectional views taken along line I-I' of FIG. 1, illustrating a method of forming a semiconductor device according to other exemplary embodiments of the present invention.

Referring to FIGS. 1 and 8, according to other exemplary embodiments of the present invention, photoresist patterns are formed on the upper mask layer 144 of FIG. 6. The photoresist patterns may be formed using a semiconductor photolithography process, which is well-known to one of ordinary skill in the art. One of the photoresist patterns may extend from the cell array region C to partially overlap a preliminary peripheral gate pattern 67. The other photoresist pattern may be disposed in the peripheral circuit region P to overlap a peripheral active region 18. The upper mask layer 144 and the intermediate mask layer 134 are sequentially etched using the photoresist patterns as an etch mask to form upper mask patterns (not shown) and intermediate mask patterns 138 of FIG. 8. The photoresist patterns are removed from the upper mask patterns while the intermediate mask patterns 138 are formed. Then, a lower mask layer 124 is etched using the upper mask patterns and the intermediate mask patterns 138 as an etch mask to form lower mask patterns 128, as shown in FIG. 8.

The upper mask patterns, the intermediate mask patterns 138, and the lower mask patterns 128 may be formed to expose a preliminary peripheral gate pattern 67. Then, according to other exemplary embodiments of the present invention, a peripheral capping layer 66 is partially etched using the upper mask patterns, the intermediate mask patterns 138, and the lower mask patterns 128 as an etch mask, as shown in FIG. 8. Here, the upper mask layer 144 is etched by a predetermined thickness T1 indicated in FIG. 6 to be removed from the semiconductor substrate 5 while the peripheral capping layer 66 is removed from an upper surface thereof by a predetermined depth D2.

Figure 9:
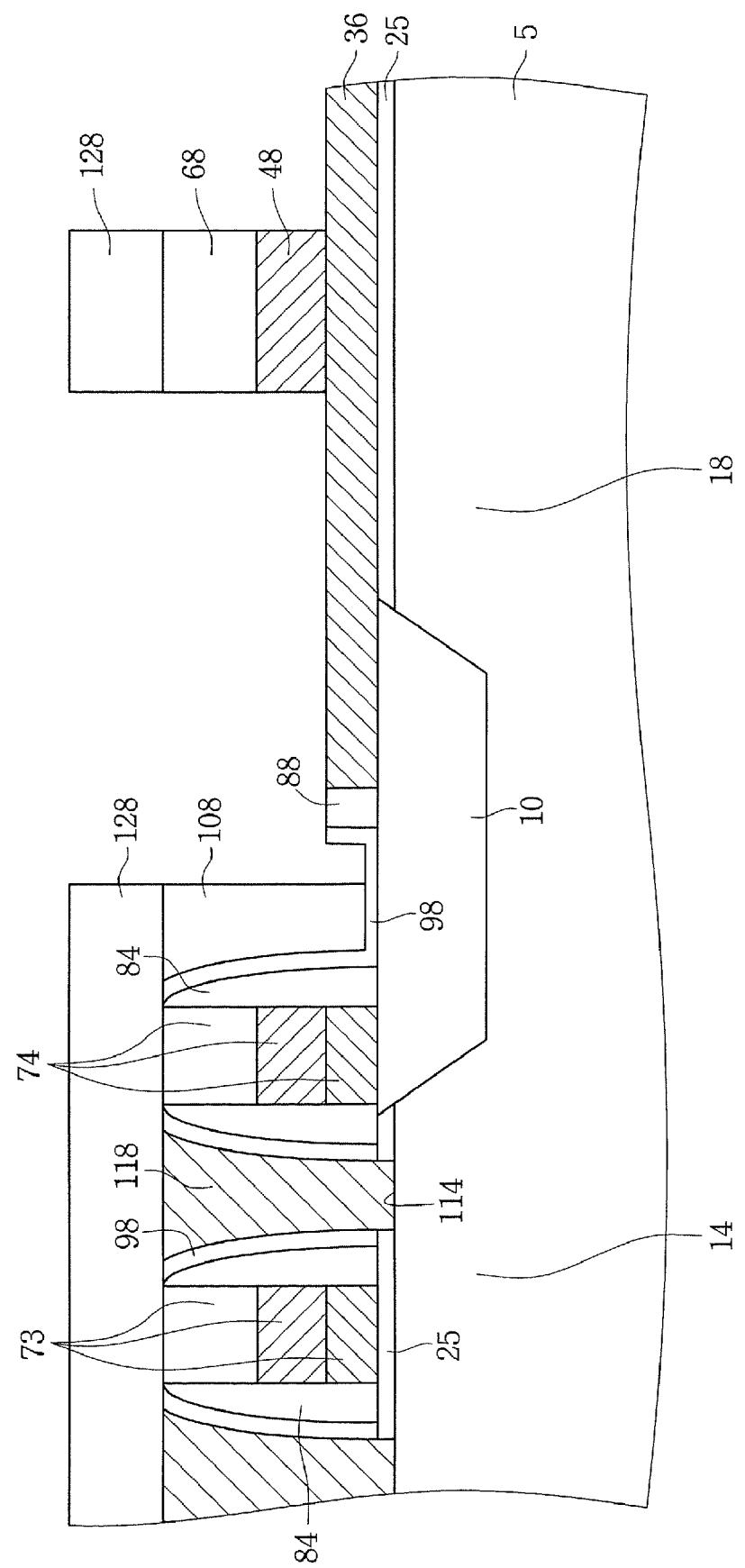

Referring to FIGS. 1 and 9, according to selected exemplary embodiments of the present invention, the peripheral capping layer 66 and the upper peripheral conductive layer 46 are continuously etched using the intermediate mask patterns 138 and the lower mask patterns 128 of FIG. 7 as an etch mask to form a peripheral gate capping pattern 68 and an upper peripheral gate electrode 48 in the peripheral circuit region P, as shown in FIG. 9. Furthermore, a cell spacer 84, a cell etch buffer pattern 98, and a buried insulating pattern 108 between the cell array region C and the peripheral circuit region P may be etched using the intermediate mask patterns 138 and the lower mask patterns 128 as an etch mask to form the defining pattern 89 of FIG. 1. Here, the cell spacer 84 and the cell etch buffer pattern 98 may be partially removed, as shown in FIG. 9, while the peripheral gate capping pattern 68 and the upper peripheral conductive layer 46 are etched. The buried insulating pattern 108 may be partially removed, as shown in FIG. 9, while the cell etch buffer pattern 98, the cell spacer 84, the peripheral capping layer 66, and the upper peripheral conductive layer 46 are etched. Also, the intermediate mask patterns 138 may be removed from the lower mask patterns 128, as shown in FIG. 9, while the upper peripheral conductive layer 46, the peripheral capping layer 66, the cell spacer 84, the cell etch buffer pattern 98, and the buried insulating pattern 108 are etched.

Meanwhile, the defining pattern 89 may be formed by self-alignment with the intermediate and lower mask patterns 138 and 128 in the cell array region C. The defining pattern 89 will be referred to as a cell space pattern 88 during the description of selected exemplary embodiments of the present invention. The cell space pattern 88 may be formed to be disposed on a isolation region 10 between the second cell gate pattern 74 and the peripheral gate pattern 76. As a modification of selected exemplary embodiments of the present invention, the cell space pattern 88 may be formed on the dummy active region 16 of FIG. 1. The cell space pattern 88 may be formed to surround the cell array region C. Also, the buried insulating pattern 108 may be disposed in the cell array region C to expose the defining pattern 89 and the cell etch buffer pattern 98.

Figure 10:
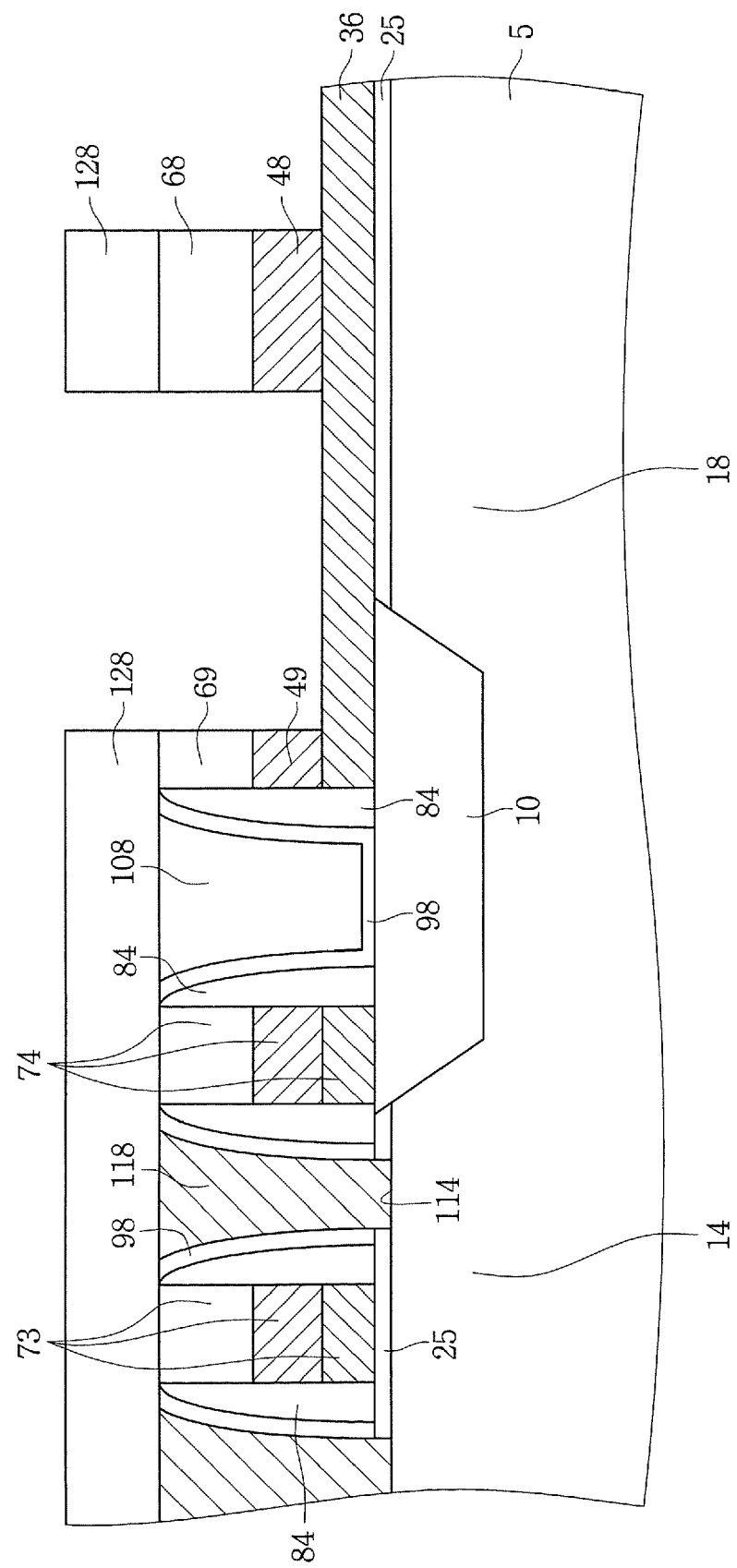

Referring to FIGS. 1 and 10, according to other exemplary embodiments of the present invention, the peripheral capping layer 66 and the upper peripheral conductive layer 46 may be continuously etched using the intermediate mask patterns 138 and the lower mask patterns 128 of FIG. 8 as an etch mask to form a dummy capping pattern 69 and an upper dummy gate 49 between the cell array region C and the peripheral circuit region P, and a peripheral gate capping pattern 68 and an upper peripheral gate electrode 48 in the peripheral circuit region P, as shown in FIG. 10. Here, the intermediate mask patterns 138 may be removed from the lower mask patterns 128 while the peripheral capping layer 66 and the upper peripheral conductive layer 46 are sequentially etched, as shown in FIG. 10.

Figure 11:
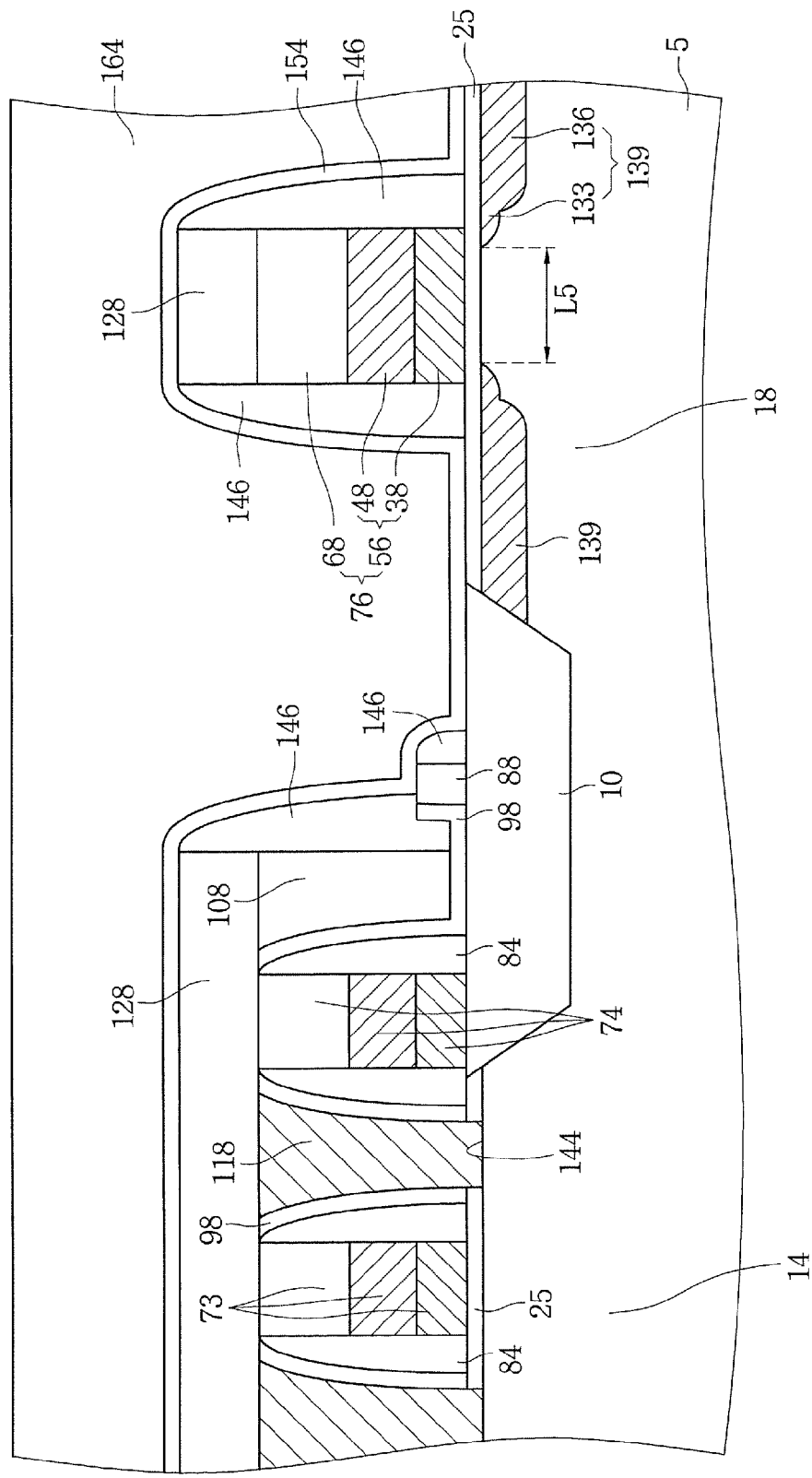

Referring to FIGS. 1 and 11, according to selected exemplary embodiments of the present invention, the lower peripheral conductive layer 36 may be etched using the upper peripheral gate electrode 48, the peripheral gate capping patterns 68, the cell space patterns 88, the cell etch buffer patterns 98, the buried insulating patterns 108, and the lower mask patterns 128 of FIG. 9 as an etch mask to form a lower peripheral gate electrode 38, as shown in FIG. 11. As a result, the lower peripheral gate electrode 38, the upper peripheral gate electrode 48, and the peripheral gate capping pattern 68 may be formed in the peripheral circuit region P. The lower peripheral gate electrode 38 and the upper peripheral gate electrode 48 may constitute a peripheral gate 56. The peripheral gate 56 and the peripheral gate capping pattern 68 may constitute a peripheral gate pattern 76, as shown in FIGS. 1 and 11. The peripheral gate pattern 76 may be formed to expose the isolation region 10 and the gate insulating layer 25 in the peripheral circuit region P.

According to selected exemplary embodiments of the present invention, low-concentration impurity regions 133 may be formed in the peripheral active region 18 using the cell space pattern 88, the cell etch buffer pattern 98, the buried insulating pattern 108 and the lower mask pattern 128 in the cell array region C, and the isolation region 10, the peripheral gate pattern 76, and the lower mask pattern 128 in a peripheral circuit region P as an etch mask, as shown in FIG. 11. The low-concentration impurity regions 133 may be formed to overlap the peripheral gate pattern 76. The low-concentration impurity regions 133 may have the same conductivity as the semiconductor substrate 5. The low-concentration impurity regions 133 may have a different conductivity from the semiconductor substrate 5. Then, peripheral spacers 146 may be formed on sidewalls of the lower mask patterns 128, the buried insulating patterns 108 and the cell space pattern 88 in the cell array region C, and on sidewalls of the lower mask pattern 128 and the peripheral gate pattern 76 in the peripheral circuit region P as shown in FIG. 11. The peripheral spacers 146 may be formed of the same material as the cell space pattern 88. The peripheral spacer 146 of the peripheral circuit region P may be formed on the cell etch buffer pattern 98 and the cell space pattern 88.

Referring back to FIGS. 1 and 11, according to selected exemplary embodiments of the present invention, high-concentration impurity regions 136 may be formed in the peripheral active region 18 using the cell space pattern 88, the lower mask pattern 128, and the peripheral spacer 146 in the cell array region C, and the isolation region 10, the lower mask pattern 128, and the peripheral spacer 146 in the peripheral circuit region P, as shown in FIG. 11. The high-concentration impurity regions 136 may be formed to overlap the low-concentration impurity regions 133. The high-concentration impurity regions 136 may be formed to have the same conductivity as the low-concentration impurity regions 133. The high-concentration impurity regions 136 may also be formed to have a different conductivity from the low-concentration impurity regions 133. The high-concentration impurity regions 136 may constitute impurity diffusion regions 139 together with the low-concentration impurity regions 133, as shown in FIG. 11. The impurity diffusion regions 139 may form an effective channel length L5 below the peripheral gate pattern 76. A peripheral etch buffer layer 154 is formed on the isolation region 10 and the gate insulating layer 25 to conformably cover the lower mask pattern 128, the peripheral spacers 146 and the cell space pattern 88 of the cell array region C, and the lower mask pattern 38 and the peripheral spacers 146 of the peripheral circuit region P, as shown in FIG. 11. The peripheral etch buffer layer 154 may be formed of the same material as the peripheral spacers 146.

According to selected exemplary embodiments of the present invention, a planarization insulating layer 164 is formed to cover the peripheral etch buffer layer 154 and fill between the second cell gate pattern 74 of the cell array region C and the peripheral gate pattern 76 of the peripheral circuit region P, as shown in FIG. 11. The planarization insulating layer 164 may be formed of a silicon oxide layer or an insulating material, in which a metal atom and/or a non-metal atom are inserted into a silicon oxide lattice. The planarization insulating layer 164 may be formed of a different material from the buried insulating patterns 108. The planarization insulating layer 164 may be formed of the same material as the buried insulating patterns 108. After the deposition of the planarization insulating layer 164 on the semiconductor substrate 5, a semiconductor annealing process is not applied to the planarization insulating layer 164 to planarize the semiconductor substrate 5. Therefore, the planarization insulating layer 164 does not impose any heat budget on the impurity diffusion regions 139 below the peripheral gate pattern 76. Accordingly, the planarization insulating layer 164 does not have an effect on the effective channel length L5 of the impurity diffusion regions 139 according to selected exemplary embodiments of the present invention.

Referring to FIGS. 1 and 12, according to other exemplary embodiments of the present invention, the lower peripheral conductive layer 36 is etched using the upper peripheral gate electrode 48, the upper dummy gate 49, the peripheral gate capping pattern 68, the dummy capping pattern 69 and mask patterns 128 of FIG. 10 as an etch mask to form a lower dummy gate 39 below the upper dummy gate 49 and a lower peripheral gate electrode 38 below the upper peripheral gate electrode 48, as shown in FIG. 12. As a result, the lower dummy gate 39, the upper dummy gate 49 and the dummy capping pattern 69 may be formed between the cell array region C and the peripheral circuit region P. The lower dummy gate 39 and the upper dummy gate 49 may constitute a dummy gate 59. The dummy gate 59 and the dummy capping pattern 69 may constitute a dummy gate pattern 79, as shown in FIG. 12. The dummy gate pattern 79 may be the defining pattern 89 of FIG. 1. Therefore, the dummy gate pattern 79 may be formed on the isolation region 10 between the second cell gate pattern 74 and the peripheral gate pattern 76. As a modification of other exemplary embodiments of the present invention, the dummy gate pattern 79 may be formed on the dummy active region 16 of FIG. 1. Also, the lower peripheral gate electrode 38, the upper peripheral gate electrode 48, and the peripheral gate capping pattern 68 may be formed in the peripheral circuit region P. The lower peripheral pattern 38 and the upper peripheral gate electrode 48 may constitute a peripheral gate 56. The peripheral gate 56 and the peripheral gate capping pattern 68 may constitute the peripheral gate pattern 76, as shown in FIGS. 1 and 12. The peripheral gate pattern 76 and the dummy gate pattern 79 may be formed to expose the isolation region 10 and the gate insulating layer 25.

According to other exemplary embodiments of the present invention, low-concentration impurity regions 133 are formed in the peripheral active region 18 using the dummy gate pattern 79 and the lower mask pattern 128 of the cell array region C and the isolation region 10, the peripheral gate pattern 76 and the lower mask pattern 128 of the peripheral circuit region P as a mask, as shown in FIG. 12. The low-concentration impurity regions 133 may be formed to overlap the peripheral gate pattern 76. Then, peripheral spacers 146 are formed on sidewalls of the peripheral gate pattern 76, the dummy gate pattern 79, and the lower mask patterns 128 as shown in FIG. 12.

Referring back to FIGS. 1 and 12, according to other exemplary embodiments of the present invention, high-concentration impurity regions 136 are formed in the peripheral active region 18 using the peripheral gate pattern 76, the dummy gate pattern 79, the lower mask patterns 128 and peripheral spacers 146 as a mask, as shown in FIG. 12. The high-concentration impurity regions 136 may be formed to overlap the low-concentration impurity regions 133. The high-concentration impurity regions 136 may constitute impurity diffusion regions 139 together with the low-concentration impurity regions 133, as shown in FIG. 12. The impurity diffusion regions 139 may form an effective channel length L6 below the peripheral gate pattern 76. A peripheral etch buffer layer 154 is formed on the isolation region 10 and the gate insulating layer 25 to conformably cover the lower mask patterns 128 and the peripheral spacers 146, as shown in FIG. 12.

According to other exemplary embodiments of the present invention, a planarization insulating layer 164 is formed to cover the peripheral etch buffer layer 154 and fill between the peripheral gate pattern 76 and the dummy gate pattern 79, as shown in FIG. 12. After the deposition of the planarization insulating layer 164 on the semiconductor substrate 5, a semiconductor annealing process is not applied to the planarization insulating layer 164 to planarize the semiconductor substrate 5. Therefore, the planarization insulating layer 164 does not impose any heat budget on the impurity diffusion regions 139 below the peripheral gate pattern 76. Accordingly, the planarization insulating layer 164 does not have an effect on the effective channel length L6 of the impurity diffusion regions 139 according to other exemplary embodiments of the present invention.

Figure 13:
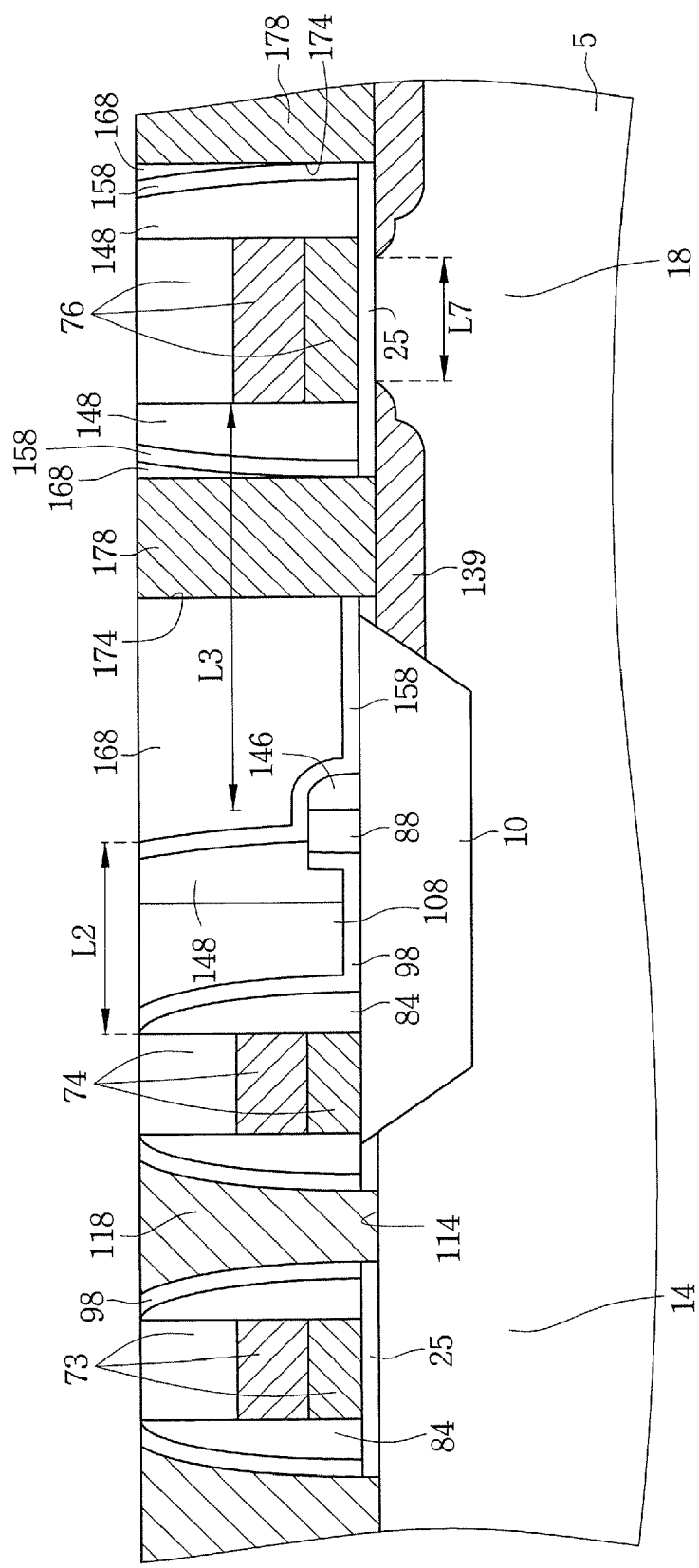

Referring to FIGS. 1 and 13, according to selected exemplary embodiments of the present invention, a planarization process is sequentially performed on the planarization insulating layer 164, the peripheral etch buffer layer 154 and the lower mask patterns 128 of FIG. 11 to form peripheral spacer patterns 148, peripheral etch buffer patterns 158 and planarization insulating patterns 168, as shown in FIG. 13. Here, the planarization process may be performed to expose the first cell gate pattern 73, the second cell gate pattern 74, the cell spacers 84, the cell etch buffer patterns 98 and the cell gate electrodes 118 of the cell array region C. Also, the planarization process may be performed to expose a peripheral gate pattern 76 of the peripheral circuit region P. As a result, a distance between the second cell gate pattern 74 and the cell space pattern 88 and a distance between the cell space pattern 88 and the peripheral gate pattern 76 may be formed to respectively have predetermined lengths L2 and L3, as shown in FIGS. 1 and 13.

Meanwhile, the planarization insulating pattern 168 may be formed to surround the peripheral gate pattern 76. Also, the peripheral spacer patterns 148 of the cell array region C may be disposed on the cell space pattern 88 to be formed between buried insulating patterns 108 and the planarization insulating patterns 168. The peripheral etch buffer patterns 158 may be disposed below the planarization insulating patterns 168 between the cell space pattern 88 and the peripheral gate pattern 76, and may be disposed between the peripheral gate pattern 76 and the planarization insulating patterns 168. The peripheral spacer patterns 148 of the peripheral circuit region P may be formed between the peripheral gate pattern 76 and the peripheral etch buffer patterns 158 to be disposed on sidewalls of the peripheral gate pattern 76.

Next, according to selected exemplary embodiments of the present invention, peripheral buried holes 174 are formed around the peripheral gate pattern 76, as shown in FIGS. 1 and 13. The peripheral buried holes 174 may be formed to pass through the planarization insulating patterns 168, the peripheral etch buffer patterns 158, and the gate insulating layer 25 to expose the impurity diffusion regions 139. Peripheral gate electrodes 178 may respectively be formed in the peripheral buried holes 174, as shown in FIG. 13. The peripheral gate electrodes 178 may be formed of conductive material. While the peripheral gate electrodes 178 are formed, the impurity diffusion regions 139 may have an effective channel length L7 below the peripheral gate pattern 76. Here, the effective channel length L7 of the impurity diffusion regions 139 in contact with the peripheral gate electrodes 178 may be substantially the same as the effective channel length L5 of the impurity diffusion regions 139 of FIG. 11. As a result, according to selected exemplary embodiments of the present invention, a semiconductor device 183 including the peripheral gate electrodes 178, the impurity diffusion regions 139 and the peripheral gate pattern 76 in the peripheral circuit region P, the cell space pattern 88 between the cell array region C and the peripheral circuit region P, and the cell gate electrodes 118 and the first and second cell gate patterns 73 and 74 in the cell array region C may be formed.

Referring to FIGS. 1 and 14, according to other exemplary embodiments of the present invention, a planarization process is sequentially performed on the planarization insulating layer 164, the peripheral etch buffer layer 154 and lower mask patterns 128 of FIG. 12 to form peripheral spacer patterns 148, peripheral etch buffer patterns 158 and planarization insulating patterns 168, as shown in FIG. 14. Here, the planarization process may be performed to expose the first cell gate pattern 73, the second cell gate pattern 74, the cell spacers 84, the cell etch buffer patterns 98 and the cell gate electrodes 118 of the cell array region C. Also, the planarization process may be performed to expose the dummy gate pattern 79 between the cell array region C and the peripheral circuit region P, and the peripheral gate pattern 76 of the peripheral circuit region P. As a result, a distance between the second cell gate pattern 74 and the dummy gate pattern 79, and a distance between the dummy gate pattern 79 and the peripheral gate pattern 76 may be formed to respectively have predetermined lengths L2 and L3, as shown in FIGS. 1 and 14.

Meanwhile, the planarization insulating pattern 168 may be formed to surround the peripheral gate pattern 76. Also, the peripheral spacer patterns 148 may be disposed on a selected sidewall of the dummy gate pattern 79 and both sidewalls of the peripheral gate pattern 76. The peripheral etch buffer patterns 158 may be formed between the planarization insulating patterns 168 and the peripheral spacer patterns 148 to be disposed below the planarization insulating patterns 168.

Then, according to other exemplary embodiments of the present invention, peripheral buried holes 174 are formed around the peripheral gate pattern 76, as shown in FIGS. 1 and 14. The peripheral buried holes 174 may be formed to pass through the planarization insulating patterns 168, the peripheral etch buffer patterns 158, and the gate insulating layer 25 to expose the impurity diffusion regions 139. Peripheral gate electrodes 178 may be respectively formed in the peripheral buried holes 174, as shown in FIG. 14. While the peripheral gate electrodes 178 are formed, the impurity diffusion regions 139 may have an effective channel length L8 below the peripheral gate pattern 76. Here, the effective channel length L8 of the impurity diffusion regions 139 in contact with the peripheral gate electrodes 178 may be substantially the same as the effective channel length L6 of the impurity diffusion regions 139 of FIG. 12. As a result, according to other exemplary embodiments of the present invention, a semiconductor device 186 including the peripheral gate electrodes 178, the impurity diffusion regions 139 and the peripheral gate pattern 76 in the peripheral circuit region P, the dummy gate pattern 79 between the cell array region C and the peripheral circuit region P, and the cell gate electrodes 118 and the first and second cell gate patterns 73 and 74 in the cell array region C may be formed.

Figure 15:
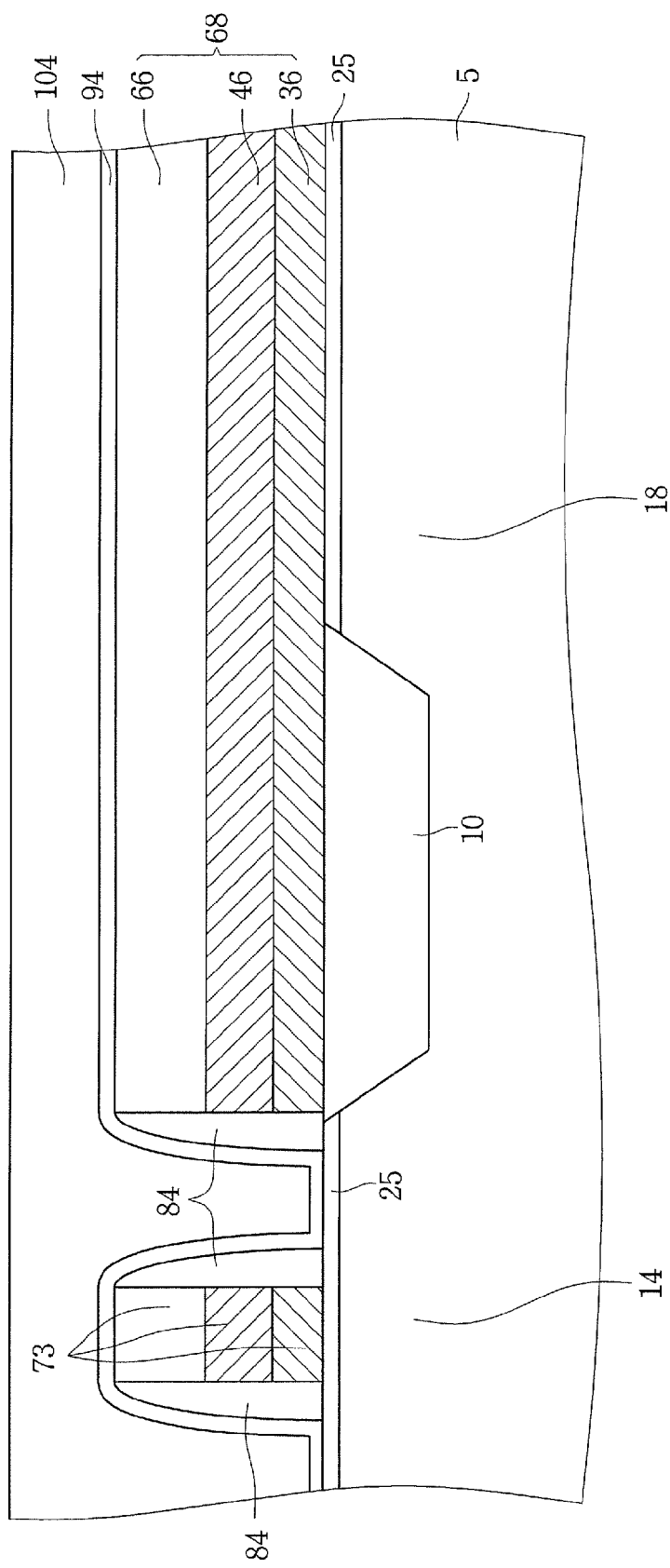
FIGS. 15 and 16 are cross-sectional views taken along line I-I' of FIG. 1, illustrating a method of forming a semiconductor device according to still other exemplary embodiments of the present invention.

FIGS. 15 and 16 are cross-sectional views taken along line I-I' of FIG. 1, illustrating a method of forming a semiconductor device according to still other exemplary embodiments of the present invention. In the still other exemplary embodiments of the present invention, a method of forming a semiconductor device will be described with reference to FIGS. 1 to 4. Also, in the still other exemplary embodiments of the present invention, like reference numerals designate like elements throughout FIGS. 5 to 14.

Referring to FIGS. 1 and 15, according to still other exemplary embodiments of the present invention, photoresist patterns are formed on the capping layer 62 of FIG. 4. The photoresist patterns may be formed using a semiconductor photolithography process that is well-known to one of ordinary skill in the art. One of the photoresist patterns may be disposed in the cell array region C to overlap the cell active region 14. The other photoresist pattern may be formed in the peripheral circuit region P to surround the cell array region C. The capping layer 62, the upper conductive layer 42, and the lower conductive layer 32 are sequentially etched using the photoresist patterns as an etch mask to form a first cell gate pattern 73 in the cell array region C and a preliminary peripheral gate pattern 68 adjacent to the first cell gate pattern 73. The preliminary peripheral gate pattern 68 may be formed to extend from the cell array region C and cover the peripheral circuit region P, as shown in FIG. 15.

Meanwhile, the first cell gate pattern 73 may be formed to have a cell gate 53 and a cell gate capping pattern 63, which are sequentially stacked, as shown in FIG. 5. As a result, the cell gate 53 may be formed to have a lower cell gate electrode 34 and an upper cell gate electrode 44, which are sequentially stacked. The preliminary peripheral gate pattern 68 may be formed to have a lower peripheral conductive layer 36, an upper peripheral conductive layer 46, and a peripheral capping layer 66, which are sequentially stacked, as shown in FIG. 15. The preliminary peripheral gate pattern 68 may be disposed on a isolation region 10 by extending from the peripheral active region 18 to be adjacent to the first cell gate pattern 73.

According to still other exemplary embodiments of the present invention, after the formation of the first cell gate pattern 73, the photoresist patterns are removed from the semiconductor substrate 5. Then, cell spacers 84 are formed on sidewalls of the first cell gate pattern 73 and the preliminary peripheral gate pattern 68, as shown in FIG. 15. Subsequently, a cell etch buffer layer 94 is formed on the isolation region 10, the gate insulating layer 25, and the cell spacers 84 to conformably cover the first cell gate pattern 73 and the preliminary peripheral gate pattern 68, as shown in FIG. 15. Then, a buried insulating layer 104 is formed on the cell spacers 84 to fill between the first cell gate pattern 73 and the preliminary peripheral gate pattern 68, as shown in FIG. 15.

Referring to FIGS. 1 and 16, according to still other exemplary embodiments of the present invention, after the formation of the cell etch buffer patterns 98 and the buried insulating patterns 108 in the cell array region C, as shown in FIG. 6, a lower mask layer 124, an intermediate mask layer 134, and an upper mask layer 144 are sequentially formed. Then, photoresist patterns are formed on the upper mask layer 144. The photoresist patterns may be formed using a semiconductor photolithography process, which is well-known to one of ordinary skill in the art. One of the photoresist patterns may be disposed in the cell array region C to partially overlap the preliminary peripheral gate pattern 68 by extending from the first cell gate pattern 73. Also, the other photoresist pattern may be disposed in the peripheral circuit region P to overlap the peripheral active region 18.

The upper mask layer 144 and the intermediate mask layer 134 are etched using the photoresist patterns as an etch mask, as shown in FIG. 8, to form upper mask patterns (not shown) and intermediate mask patterns 138. Here, the photoresist patterns may be removed from the upper mask patterns while the intermediate mask patterns 138 are formed. Subsequently, the lower mask layer 124 is etched using the upper mask patterns 148 and the intermediate mask patterns 138 as an etch mask, as shown in FIG. 10, to form lower mask patterns 128. Further, the peripheral capping layer 66, the upper peripheral conductive layer 46 and the lower peripheral conductive layer 36 are sequentially etched using the upper mask pattern, the intermediate and lower mask patterns 138 and 128 as an etch mask to form a second cell gate pattern 74 in the cell array region C and a peripheral gate pattern 76 in peripheral circuit region P.

The intermediate mask patterns 138 may be removed from the lower mask patterns 128 while the second cell gate pattern 74 and the peripheral gate pattern 76 are formed, as shown in FIG. 10. The second cell gate pattern 74 and the peripheral gate pattern 76 may have the same components as the second cell gate pattern 74 and the peripheral gate pattern 76 of FIG. 12. Then, peripheral spacers 146 are formed on sidewalls of the lower mask pattern 128 and the second cell gate pattern 74 in the cell array region C and sidewalls of the lower mask pattern 128 and the peripheral gate pattern 76 in the peripheral circuit region P, as shown in FIG. 12. Here, before/after the formation of the peripheral spacers 146, impurity diffusion regions 139 overlapping the peripheral gate pattern 76 may be formed in the semiconductor substrate 5, as shown in FIG. 12.

Referring again to FIGS. 1 to 16, according to still other exemplary embodiments of the present invention, a peripheral etch buffer layer 154 and a planarization insulating layer 164 may be sequentially formed on the isolation region 10, the gate insulating layer 25, the lower mask patterns 128 and the peripheral spacers 146 to fill between the second cell gate pattern 74 and the peripheral gate pattern 76, as shown in FIG. 12. Then, a planarization process is sequentially performed on the planarization insulating layer 164, the peripheral etch buffer layer 154 and the lower mask patterns 128 to sequentially form peripheral spacer patterns 148, peripheral etch buffer patterns 158 and planarization insulating patterns 168 to expose the first and second cell gate patterns 73 and 74, and the peripheral gate pattern 76, as shown in FIG. 16. The peripheral etch buffer patterns 158 and the planarization insulating patterns 168 may be formed between the second cell gate pattern 74 and the peripheral gate pattern 76, and around the peripheral gate pattern 76. The peripheral spacer patterns 148 may be formed on a selected sidewall of the second cell gate pattern 74 and both sidewalls of the peripheral gate pattern 76.

According to still other exemplary embodiments of the present invention, peripheral buried holes 174 are formed around the peripheral gate pattern 76, as shown in FIGS. 1 and 16. The peripheral buried holes 174 may be formed to pass through the planarization insulating patterns 168, the peripheral etch buffer patterns 158, and the gate insulating layer 25 to expose the impurity diffusion regions 139. Peripheral gate electrodes 178 may respectively be formed in the peripheral buried holes 174. While the peripheral gate electrodes 178 are formed, the impurity diffusion regions 139 may have an effective channel length L9 below the peripheral gate pattern 76. Here, the effective channel length L9 of the impurity diffusion regions 139 in contact with the peripheral gate electrodes 178 may be substantially the same as the effective channel length L7 or L8 of the impurity diffusion regions 139 of FIG. 13 or 14. As a result, according to still other exemplary embodiments of the present invention, a semiconductor device 189 including the peripheral gate electrodes 178, the impurity diffusion regions 139 and the peripheral gate pattern 76 in the peripheral circuit region P, and the cell gate electrode 118 and the first and second cell gate patterns 73 and 74 in the cell array region C may be formed.

As described above, semiconductor devices having different insulating patterns respectively disposed in a cell array region and a peripheral circuit region are provided. In the semiconductor devices, buried insulating patterns and planarization insulation patterns are respectively disposed around cell gate patterns and peripheral gate patterns in response to a reduced design rule, so that a limit in disposing components on a semiconductor substrate is improved.

Also, embodiments of the present invention provide methods of forming a semiconductor device, in which different insulating patterns are respectively formed in a cell array region and a peripheral circuit region to impose different heat budgets on the respective regions. In the methods of forming the semiconductor device, buried insulating patterns, to which a semiconductor annealing process is applied, are disposed in the cell array region, and planarization insulating patterns, to which a semiconductor annealing process is not applied, are disposed in the peripheral circuit region, so that impurity diffusion regions are prevented from being diffused below peripheral gate patterns.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A semiconductor device comprising:
   a semiconductor substrate having a cell array region and a peripheral circuit region;
   first and second cell gate patterns disposed in the cell array region, and sequentially arranged outwardly from a center of the cell array region;
   a peripheral gate pattern disposed in the peripheral circuit region;
   a defining pattern disposed between the cell array region and the peripheral circuit region to surround the cell array region;
   buried insulating patterns disposed around the first cell gate pattern, between the first and second cell gate patterns, and between the second cell gate pattern and the defining pattern;
   planarization insulating patterns disposed between the defining pattern and the peripheral gate pattern, and around the peripheral gate pattern;
   isolation regions disposed in the cell array region and the peripheral circuit region to define a cell active region of the cell array region and a peripheral active region of the peripheral circuit region, wherein the first and second cell gate patterns have a lower cell gate electrode, an upper cell gate electrode and a cell gate capping pattern, which are sequentially stacked and are respectively disposed on the cell active region and the isolation regions and the peripheral gate pattern has a lower peripheral gate electrode, an upper peripheral gate electrode and a peripheral gate capping pattern, which are sequentially stacked, to be disposed on the peripheral active region;
   cell spacers respectively disposed on sidewalls of the first and second cell gate patterns; and
   a pair of peripheral spacer patterns disposed on sidewalls of the peripheral gate pattern;
   wherein one of the cell spacers and one of the peripheral spacer patterns are disposed on sidewalls of the defining pattern, and wherein the defining pattern is a dummy gate pattern disposed on the isolation regions between the second cell gate pattern and the peripheral gate pattern, and the dummy gate pattern is a lower dummy gate, an upper dummy gate and a dummy capping pattern, which are sequentially stacked.

2. A semiconductor device, comprising:
   a semiconductor substrate having a cell array region and a peripheral circuit region;
   first and second cell gate patterns disposed in the cell array region, and sequentially arranged outwardly from a center of the cell array region;

a peripheral gate pattern disposed in the peripheral circuit region;

a defining pattern disposed between the cell array region and the peripheral circuit region to surround the cell array region;

buried insulating patterns disposed around the first cell gate pattern, between the first and second cell gate patterns, and between the second cell gate pattern and the defining pattern;

planarization insulating patterns disposed between the defining pattern and the peripheral gate pattern, and around the peripheral gate pattern;

isolation regions disposed in the cell array region and the peripheral circuit region to define a cell active region of the cell array region and a peripheral active region of the peripheral circuit region, wherein the first and second cell gate patterns have a lower cell gate electrode, an upper cell gate electrode and a cell gate capping pattern, which are sequentially stacked, and are respectively disposed on the cell active region and the isolation regions, and the peripheral gate pattern has a lower peripheral gate electrode, an upper peripheral gate electrode and a peripheral gate capping pattern, which are sequentially stacked, to be disposed on the peripheral active region;

cell spacers respectively disposed on sidewalls of the first and second cell gate patterns; and a pair of peripheral spacer patterns disposed on sidewalls of the peripheral gate pattern wherein one of the peripheral spacer patterns is disposed between the second cell gate pattern and the peripheral gate pattern to be in contact with the buried insulating patterns and the planarization insulating patterns, and wherein the defining pattern is a cell space pattern disposed on the isolation regions between the second cell gate pattern and the peripheral gate pattern, and the cell space pattern is disposed below the other peripheral spacer pattern.

* * * * *